US009166135B2

(12) United States Patent
Ramer et al.

(10) Patent No.: US 9,166,135 B2
(45) **Date of Patent: *Oct. 20, 2015**

(54) OPTICAL/ELECTRICAL TRANSDUCER USING SEMICONDUCTOR NANOWIRE WICKING STRUCTURE IN A THERMAL CONDUCTIVITY AND PHASE TRANSITION HEAT TRANSFER MECHANISM

(71) Applicant: ABL IP HOLDING LLC, Conyers, GA (US)

(72) Inventors: David P. Ramer, Reston, VA (US); Jack C. Rains, Jr., Herndon, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,504

(22) Filed: May 2, 2014

(65) Prior Publication Data

US 2014/0291702 A1 Oct. 2, 2014

Related U.S. Application Data

(63) Continuation of application No. 13/221,050, filed on Aug. 30, 2011, now Pat. No. 8,759,843.

(51) Int. Cl.
*H01L 27/15* (2006.01)
*H01L 33/64* (2010.01)
(Continued)

(52) U.S. Cl.
CPC .............. *H01L 33/648* (2013.01); *F28D 15/02* (2013.01); *F28D 15/046* (2013.01);
(Continued)

(58) Field of Classification Search
CPC ...... H01L 33/648; H01L 33/24; H01L 31/052
USPC ....................... 257/81, 678, 706, 99, E33.075
See application file for complete search history.

(56) References Cited

U.S. PATENT DOCUMENTS 3,596,125 A 7/1971 Seigel
4,874,731 A 10/1989 Sachtler et al.
(Continued)

FOREIGN PATENT DOCUMENTS

DE 10213042 A1 10/2003
EP 0144071 A2 6/1985
(Continued)

OTHER PUBLICATIONS

Entire prosecution history of U.S. Appl. No. 13/221,050, entitled "Optical/Electrical Transducer Using Semiconductor Nanowire Wicking Structure in a Thermal Conductivity and Phase Transition Heat Transfer Mechanism," filed Aug. 30, 2011.
(Continued)

*Primary Examiner* — Julia Slutsker
(74) *Attorney, Agent, or Firm* — RatnerPrestia

(57) ABSTRACT

An optical/electrical transducer device has housing, formed of a thermally conductive section and an optically transmissive member. The section and member are connected together to form a seal for a vapor tight chamber. Pressure within the chamber configures a working fluid to absorb heat during operation of the device, to vaporize at a relatively hot location as it absorbs heat, to transfer heat to and condense at a relatively cold location, and to return as a liquid to the relatively hot location. The transducer device also includes a wicking structure mounted within the chamber to facilitate flow of condensed liquid of the working fluid from the cold location to the hot location. At least a portion of the wicking structure comprises semiconductor nanowires, configured as part of an optical/electrical transducer within the chamber for emitting light through and/or driven by light received via the transmissive member.

20 Claims, 8 Drawing Sheets

(51) Int. Cl.

| | |
|---|---|
| ***H01L 31/052*** | (2014.01) |
| ***F28D 15/02*** | (2006.01) |
| ***F28D 15/04*** | (2006.01) |
| ***H01L 31/024*** | (2014.01) |
| ***H01L 31/147*** | (2006.01) |
| *H01L 33/24* | (2010.01) |

(52) U.S. Cl.

CPC ........... *H01L 31/024* (2013.01); *H01L 31/052* (2013.01); *H01L 31/147* (2013.01); *H01L 33/24* (2013.01); *H01L 2924/0002* (2013.01); *Y02E 10/50* (2013.01)

(56) References Cited

U.S. PATENT DOCUMENTS

| | | | | |
|---|---|---|---|---|
| 5,070,375 | A | 12/1991 | Sakai | |
| 5,195,575 | A | 3/1993 | Wylie | |
| 5,841,244 | A | 11/1998 | Hamilton et al. | |
| 6,377,459 | B1 | 4/2002 | Gonsalves et al. | |
| 6,766,817 | B2 | 7/2004 | da Silva | |
| 6,827,134 | B1 | 12/2004 | Rightley et al. | |
| 6,834,712 | B2 | 12/2004 | Parish et al. | |
| 6,864,571 | B2 | 3/2005 | Arik | |
| 6,935,022 | B2 | 8/2005 | German et al. | |
| 6,969,843 | B1 | 11/2005 | Beach et al. | |
| 7,027,304 | B2 | 4/2006 | Aisenbrey | |
| 7,028,759 | B2 | 4/2006 | Rosenfeld et al. | |
| 7,095,110 | B2 | 8/2006 | Arik | |
| 7,124,809 | B2 | 10/2006 | Rosenfeld et al. | |
| 7,137,443 | B2 | 11/2006 | Rosenfeld et al. | |
| 7,148,632 | B2 | 12/2006 | Berman et al. | |
| 7,164,466 | B2 | 1/2007 | Hazelton | |
| 7,318,660 | B2 | 1/2008 | Yu | |
| 7,505,268 | B2 | 3/2009 | Schick | |
| 7,538,356 | B2 | 5/2009 | Lai | |
| 7,543,960 | B2 | 6/2009 | Chang et al. | |
| 7,547,124 | B2 | 6/2009 | Chang et al. | |
| 7,572,033 | B2 | 8/2009 | Sun et al. | |
| 7,651,260 | B2 | 1/2010 | Hamann et al. | |
| 7,679,916 | B2 | 3/2010 | Orr et al. | |
| 7,763,353 | B2 | 7/2010 | Geohegan et al. | |
| 7,768,192 | B2 | 8/2010 | Van De Ven et al. | |
| 7,819,556 | B2 | 10/2010 | Heffington et al. | |
| 7,821,022 | B2 | 10/2010 | Kim | |
| 7,846,751 | B2 | 12/2010 | Wang | |
| 7,857,037 | B2 | 12/2010 | Parish et al. | |
| 7,898,176 | B2 | 3/2011 | Ii et al. | |
| 8,710,526 | B2 * | 4/2014 | Ramer et al. | 257/98 |
| 8,723,205 | B2 * | 5/2014 | Ramer et al. | 257/98 |
| 8,759,843 | B2 * | 6/2014 | Ramer et al. | 257/81 |
| 2004/0244963 | A1 | 12/2004 | Hazelton | |
| 2006/0066221 | A1 | 3/2006 | Belinski-Wolfe et al. | |
| 2006/0279191 | A1 | 12/2006 | Geohegan | |
| 2007/0102143 | A1 | 5/2007 | Yu et al. | |
| 2007/0295968 | A1 | 12/2007 | Tan et al. | |
| 2008/0042429 | A1 | 2/2008 | Schick et al. | |
| 2008/0093962 | A1 | 4/2008 | Kim et al. | |
| 2008/0128898 | A1 | 6/2008 | Henderson et al. | |
| 2008/0205062 | A1 | 8/2008 | Dahm et al. | |
| 2008/0219007 | A1 | 9/2008 | Heffington et al. | |
| 2008/0285271 | A1 | 11/2008 | Roberge et al. | |
| 2009/0014154 | A1 | 1/2009 | Schick et al. | |
| 2009/0201577 | A1 | 8/2009 | LaPlante et al. | |
| 2010/0038660 | A1 | 2/2010 | Shuja | |
| 2010/0044697 | A2 | 2/2010 | Liu et al. | |
| 2010/0200199 | A1 | 8/2010 | Habib et al. | |
| 2010/0265717 | A1 | 10/2010 | Luettgens et al. | |
| 2010/0283064 | A1 | 11/2010 | Samuelson et al. | |
| 2011/0228516 | A1 | 9/2011 | Stewart et al. | |
| 2011/0255268 | A1 | 10/2011 | Horn et al. | |
| 2012/0026723 | A1 | 2/2012 | Wheelock et al. | |
| 2012/0033440 | A1 | 2/2012 | Wheelock et al. | |
| 2012/0044678 | A1 | 2/2012 | Aggarwal et al. | |
| 2013/0049018 | A1 * | 2/2013 | Ramer et al. | 257/81 |
| 2013/0049040 | A1 * | 2/2013 | Ramer et al. | 257/98 |
| 2013/0049041 | A1 * | 2/2013 | Ramer et al. | 257/98 |

FOREIGN PATENT DOCUMENTS

| | | | |
|---|---|---|---|
| JP | 60158649 | A | 8/1985 |
| WO | 2007069119 | A1 | 6/2007 |

OTHER PUBLICATIONS

Entire prosecution history of U.S. Appl. No. 13/221,083, entitled “Phosphor Incorporated in a Thermal Conductivity and Phase Transition Heat Transfer Mechanism,” filed Aug. 30, 2011.

Entire prosecution history of U.S. Appl. No. 13/221,244, entitled “Thermal Conductivity and Phase Transition Heat Transfer Mechanism Including Optical Element to Be Cooled by Heat Transfer of the Mechanism,” filed Aug. 30, 2011.

Notice of Allowance issued Dec. 9, 2013, in U.S. Appl. No. 13/221,244, filed Aug. 30, 2011 by David P. Ramer, et al.

Notice of Allowance issued Nov. 25, 2013, in U.S. Appl. No. 13/221,083, filed Aug. 30, 2011 by David P. Ramer, et al.

L. Davis et al., “Photoluminescent Nanofibers for Solid-State Lighting Applications,” RTI International.

M.S. Dresselhaus, “Nanostructures and Energy Conversion,” Proceedings of 2003 Rohsenow Symposium on Future Trends of Heat Transfer, May 16, 2003.

H.P.J. de Bock et al., “Experimental Investigation of Micro/Nano Heat Pipe Wick Structures,” Proceedings of the ASME International Mechanical Engineering Congress and Exposition, IMECE2008, Oct. 31-Nov. 6, 2008.

T. Ogoshi et al., “Transparent ionic piqued-phenol resin hybrids with high ionic conductivity,” Polymer journal 43, 421-424 (Apr. 2011).

Ionic Liquids Today, Issue 3-07, Wednesday, Oct. 31, 2007, <www.iolitec.com>.

Y.-S. Cho et al., “Preparation of Transparent Red-Emitting YVO4:Eu Nanophosphor Suspensions,” Bull. Korean Chem. Soc. 2011, vol. 32, No. 1.

J. Olivia et al., “Effect of Ammonia on luminescent properties of YAG:Ce3+, Pr3+ nanophosphors,” Proc. SPIE 7755, 77550E (2010).

Engineers Edge Solutions by Design, “Fluid Characteristics Chart/Data, Density, Vapor Pressure and Viscosity/Data, ”printed from <http://www.engineersedge.com/fluid_flow/fluid_datahtm> on Aug. 15, 2011.

What is a Heat Pipe? printed from <http://www.cheresources.com/htpipes.shtml> on Aug. 15, 2011.

Non-final office action dated Apr. 23, 2015, issued in U.S. Appl. No. 14/249,736, entitled “Optical/Electrical Transducer Using Semiconductor Nanowire Wicking Structure in a Thermal Conductivity and Phase Transition Heat Transfer Mechanism,” filed Apr. 10, 2014.

Non-final office action issued dated Aug. 10, 2015 in U.S. Appl. No. 14/249,736.

* cited by examiner

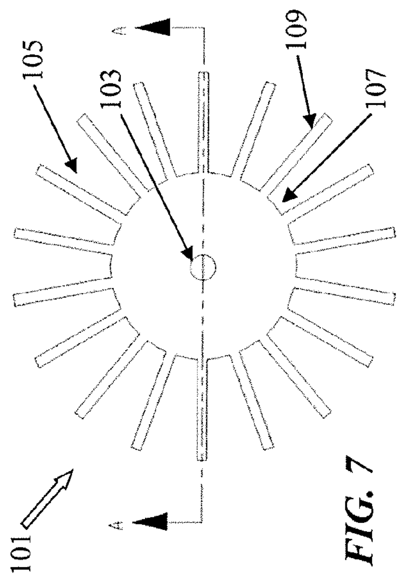
FIG. 7
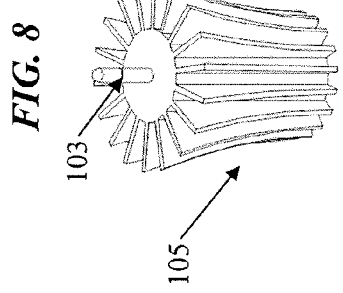
FIG. 8
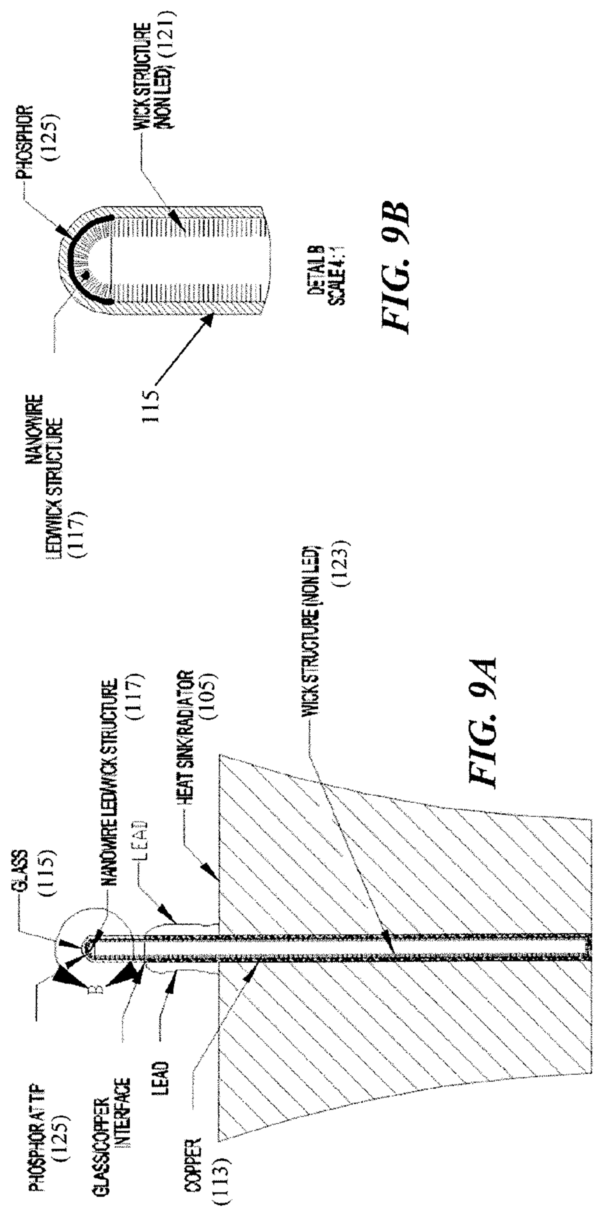
FIG. 9A
FIG. 9B

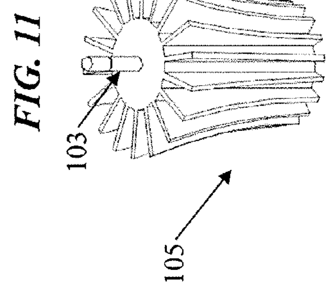
*FIG. 11*
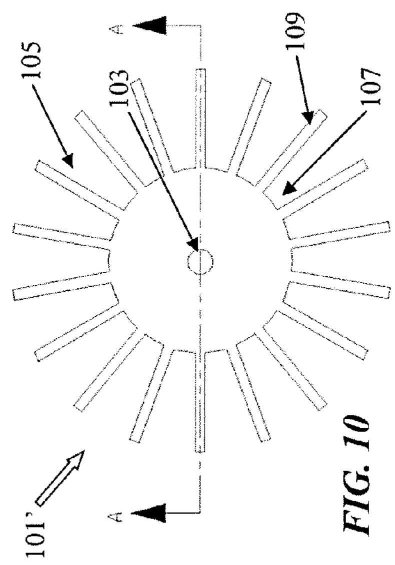
*FIG. 10*
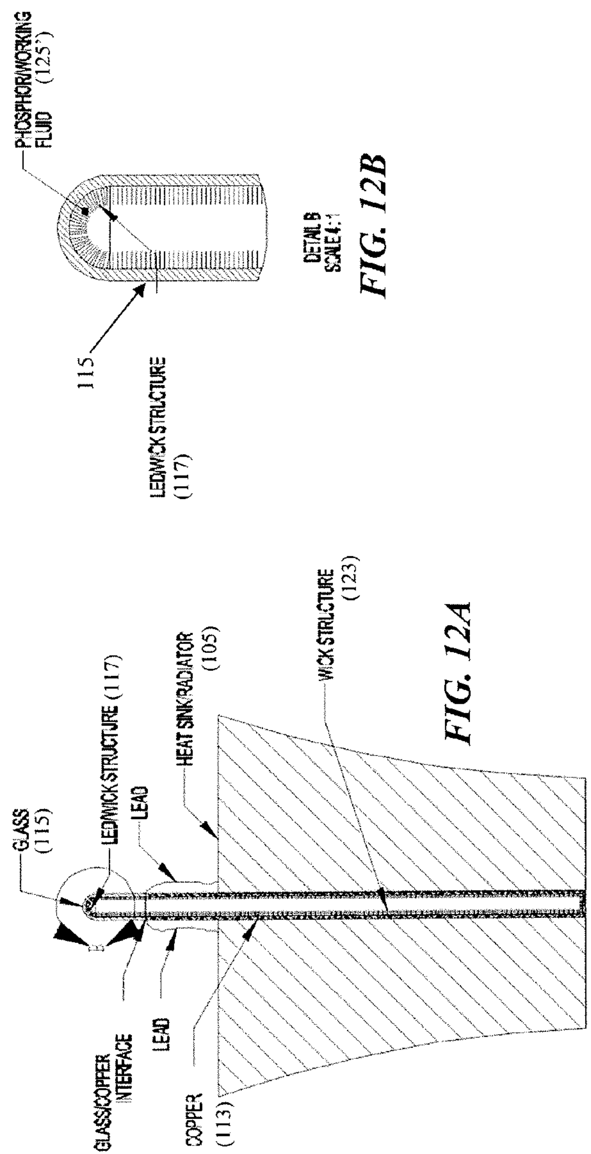
*FIG. 12B*
*FIG. 12A*

OPTICAL/ELECTRICAL TRANSDUCER USING SEMICONDUCTOR NANOWIRE WICKING STRUCTURE IN A THERMAL CONDUCTIVITY AND PHASE TRANSITION HEAT TRANSFER MECHANISM

RELATED APPLICATIONS

This application is a continuation of U.S. patent application Ser. No. 13/221,050, filed Aug. 30, 2011 entitled "OPTICAL/ELECTRICAL TRANSDUCER USING SEMICONDUCTOR NANOWIRE WICKING STRUCTURE IN A THERMAL CONDUCTIVITY AND PHASE TRANSITION HEAT TRANSFER MECHANISM," the entire contents of which are incorporated herein by reference.

This application is related to U.S. patent application Ser. No. 13/221,244 filed Aug. 30, 2011 entitled "THERMAL CONDUCTIVITY AND PHASE TRANSITION HEAT TRANSFER MECHANISM INCLUDING OPTICAL ELEMENT TO BE COOLED BY HEAT TRANSFER OF THE MECHANISM."

This application is related to U.S. patent application Ser. No. 13/221,083 filed Aug. 30, 2011 entitled "PHOSPHOR INCORPORATED IN A THERMAL CONDUCTIVITY AND PHASE TRANSITION HEAT TRANSFER MECHANISM."

BACKGROUND

Many different types of active optical elements for emitting or responding to light used in optical/electrical transducers require effective dissipation of heat. Consider a semiconductor light emitter, such as a light emitting diode (LED) or laser diode, as a first example. To generate more light, the device is driven harder by a higher power drive current. However, the device then generates more heat.

The semiconductor may be damaged or break down if healed to or above a certain temperature. If the temperature gets too high, the device may burn out instantly. All semiconductor light emitters decline in efficiency of light generation as they are operated over time. However, even if the temperature is not high enough to burn out the device quickly, operating a semiconductor light emitter at relatively high temperatures (but below the burn-out temperature) for an extended period will cause the semiconductor light emitter to degrade more quickly than if operated at lower temperatures. Even when a device is running within its rated temperature, the hotter it gets, the less efficient it becomes. Conversely, the cooler the device operates, the more efficient it is.

Many available types of LEDs fail at ~150° C. LED performance data typically is based on junction temperature of 25° C. However, at more typical junction temperatures (~100° C.), operating performance is degraded by ~20% from the specified performance data.

As a solid state light emitter device such as a LED operates, the semiconductor generates heat. The heat must be effectively dissipated and/or the electrical drive power (and thus light output) must be kept low enough, to avoid breakdown or rapid performance degradation and/or to maintain operating efficiency. The package or enclosure of the semiconductor light emitter device typically includes a heat slug of a high thermal conductivity, which is thermally coupled to the actual semiconductor that generates the light. In operation, the slug is thermally coupled to a cooling mechanism outside the device package, such as a heat pipe and/or a heat sink. External active cooling may also be provided.

To increase the intensity of the light generated, the semiconductor light emitter may be driven with a higher intensity electrical current. Alternatively, an overall system or lighting device may include a number of semiconductor light emitters which together can produce a desired quantity of light output. With either approach, the increase in intensity of generated light increases the amount of heat that needs to be dissipated to avoid breakdown or rapid performance degradation and/or to maintain operating efficiency.

The examples above relate to light generation devices or systems. However, similar heat dissipation issues may arise in devices or systems that convert light to other forms of energy such as electricity. For example light sensors or detectors and/or photovoltaic devices may degrade or breakdown if overheated, e.g. if subject to particularly intense input light of if subject to high light input over extended time periods. Even when a device is running within its rated temperature, the hotter it gets, the less efficient it becomes. Conversely, the cooler the device operates, the more efficient it is.

For these and other types of active optical elements for emitting or responding to light, there is a continuing need for ever more effective dissipation of heat. Improved heat dissipation may provide a longer operating life for the active optical element. Improved heat dissipation may allow a light emitter to be driven harder to emit more light or allow a detector/second or photovoltaic to receive and process more intense light.

Many thermal strategies have been tried to dissipate heat from and cool active optical elements. Many systems or devices that incorporate active optical elements use a heat sink to receive and dissipate heat from the active optical element(s). A heat sink is a component or assembly that transfers generated heat to a lower temperature medium. Although the lower temperature medium may be a liquid, the lower temperature medium often is air.

A larger heat sink with more surface area dissipates more heat to the ambient atmosphere. However, there is often a tension or trade off between the size and effectiveness of the heat sink versus the commercially viable size of the device that must incorporate the sink. For example, if a LED based lamp must conform to the standard form factor of an A-lamp, that form factor limits the size of the heat sink. To improve thermal performance for some applications, an active cooling element may be used, to dissipate heat from a heat sink or from another thermal element that receives heat from the active optical element(s). Examples of active cooling elements include fans, Peltier devices, membronic cooling elements and the like.

Other thermal strategies for equipment that use active optical elements have utilized heat pipes or other devices based on principles of a thermal conductivity and phase transition heat transfer mechanism. A heat pipe or the like may be used alone or in combination with a heat sink and/or an active cooling element.

A device such as a heat pipe relies on thermal conductivity and phase transition between evaporation and condensation to transfer heat between two interfaces. Such a device includes a vapor chamber and working fluid within the chamber, typically at a pressure somewhat lower than atmospheric pressure. The working fluid, in its liquid state, contacts the hot interface where the device receives heat input. As the liquid absorbs the heat, it vaporizes. The vapor fills the otherwise empty volume of the chamber. Where the chamber wall is cool enough (the cold interface), the vapor releases heat to the wall of the chamber and condenses back into a liquid. Thermal conductivity at the cold interface allows heat transfer away from the mechanism, e.g. to a heat sink or to ambient air.

By gravity or a wicking structure, the liquid form of the fluid flows back to the hot interface. In operation, the working fluid goes through this evaporation, condensation and return flow to form a repeating thermal cycle that effectively transfers the heat from the hot interface to the cold interface. Devices like heat pipes can be more effective than passive elements like heat sinks, and they do not require power or mechanical parts as do active cooling elements. It is best to get the heat away from the active optical element as fast as possible, and the heat pipe improves heat transfer away from the active optical element, even where transferring the heat to other heat dissipation elements.

Although these prior technologies do address the thermal issues somewhat, there is still room for further improvement.

For example, passive cooling elements, active cooling elements and heat transfer mechanisms that rely on thermal conductivity and phase transition have been implemented outside of the devices that incorporate active optical elements. A light processing device may include one or more elements coupled to the actual active optical element to transfer heat to the external thermal processing device. In our LED example, heat passes through of the layers of the semiconductor, to the heat slug and then to the external thermal processing device(s). The need to transfer the heat through so many elements and the various interfaces between those elements reduces efficiency in cooling the thermally susceptible component(s) of the active optical element. Again referencing the LED example, the need to transfer the heat through so many elements reduces efficiency in cooling the LED chip, particularly cooling at the internal the layer/point in the semiconductor chip where the light is actually generated.

It has been suggested that a heat pipe type mechanism could be incorporated at the package level with the LED (WO 2007/069119 (A1)). However, even in that device, a heat spreader and a light transmissive collimator encapsulate the actual LED chip and separate the chip from the working fluid. Heat from the LED chip structure is transferred through the heat spreader to the working fluid much like the prior examples that used an external heat pipe coupled to the heat slug of the LED package.

There is an increasing desire for higher, more efficient operation (light output or response to light input) in ever smaller packages. As outlined above, thermal capacity is a limiting technical factor. Thermal capacity may require control of heat at the device level (e.g. transducer package level and/or macro device level such as in a lamp or fixture).

Hence, it may be advantageous to reduce the distance and/or number elements and interfaces that the heat must pass through from the active optical element. Also, improvement in technologies to more effectively dissipate heat from active optical elements may help to meet increasing performance demands with respect to the various types of equipment that use the active optical elements.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 7 and 8 are top and isometric views of a light emitting type optical/electrical transducer apparatus and heat sink as may be used in a fixture or lamp/light bulb.

FIG. 9A is a cross-sectional view taken along line A-A of FIG. 7.

FIG. 9B is an enlarged detail view of a portion of the optical/electrical transducer apparatus and heat sink of FIG. 9A.

FIGS. 10 and 11 are top and isometric views of another light emitting type optical/electrical transducer apparatus and heat sink as may be used in a fixture or lamp/light bulb.

FIG. 12A is a cross-sectional view taken along line A-A of FIG. 10.

FIG. 12B is an enlarged detail view of a portion of the optical/electrical transducer apparatus and heat sink of FIG. 12A, showing the addition of a phosphor layer.

DETAILED DESCRIPTION

Figure 1:
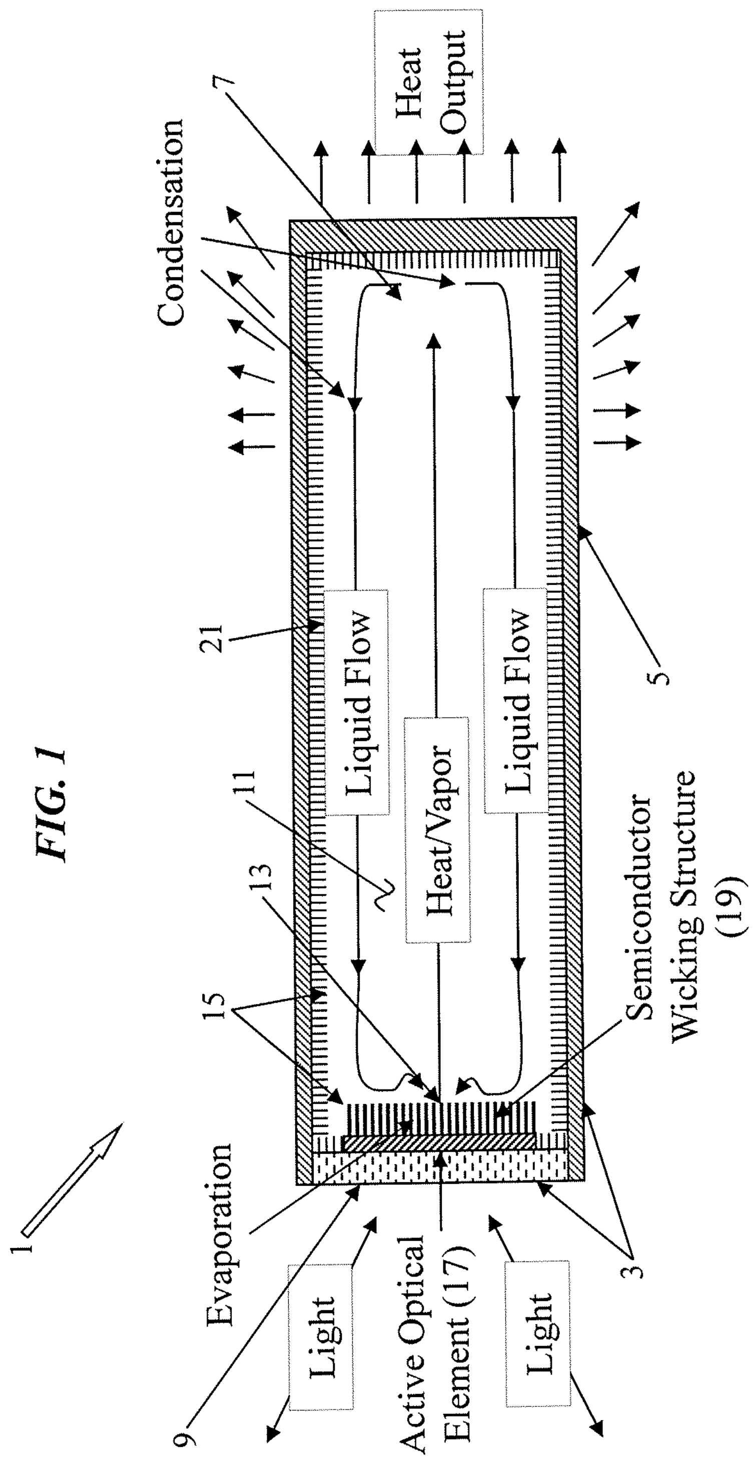
FIG. 1 is a cross-sectional view of an example of an optical/electrical transducer apparatus, in the form of a thermal conductivity and phase transition heat transfer mechanism that incorporates a semiconductor transducer utilizing semiconductor nanowires that also form at least a portion of the wicking structure of the thermal conductivity and phase transition heat transfer mechanism.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various technologies disclosed herein relate to apparatuses, devices or systems in which the semiconductor of an optical/electrical transducer takes the form of semiconductor nanowires. The nanowires of the transducer also are part of the internal wicking structure of a thermal conductivity and phase transition heat transfer mechanism that incorporates the transducer. A variety of examples of such arrangements as well as techniques for making and operating such transducers are discussed below. An optical/electrical transducer apparatus is a device that converts between forms of optical and electrical energy, for example, from optical energy to an electrical signal or from electrical energy to an optical output. Examples of optical-to-electrical transducers include various sensors, photovoltaic devices and the like. Examples of electrical-to-optical transducers include various light emitters, although the emitted light may be in the visible spectrum or in other wavelength ranges.

At a high level, an exemplary optical/electrical transducer apparatus includes a housing having a section that is thermally conductive and a member that is at least partially optically transmissive. The optically transmissive member is connected to the thermally conductive section of the housing to form a seal for a vapor tight chamber enclosed by the section and the member that together form the housing, although the member does allow passage of optical energy into and/or out of the apparatus. The exemplary apparatus also includes a working fluid within the chamber. The pressure within the chamber configures the working fluid to absorb heat during operation of the apparatus, to vaporize at a relatively hot location as it absorbs heat, to transfer heat to and condense at a relatively cold location, and to return as a liquid to the relatively hot location. The exemplary apparatus also includes a wicking structure mounted within the chamber to facilitate flow of the condensed liquid of the working fluid from the cold location to the hot location of the mechanism. At least a portion of the wicking structure comprises semiconductor nanowires. The semiconductor nanowires are configured as at least part of an optical/electrical transducer within the chamber, for emitting light through and/or driven by light received via the transmissive member.

At least some surfaces of the semiconductor nanowires directly contact the working fluid for heat transfer. The phase transition heat transfer via the thermal cycle of the working fluid more efficiently transfers heat produced during operation of the transducer from the semiconductor nanowires at or near the hot location to the cold location. For example, the semiconductor nanowires are part of the wicking structure, portions of the nanowires are directly exposed to the working fluid, without any additional intervening members, layers or interfaces that might otherwise impede the transfer of heat from the transducer to the working fluid. The improved efficiency of the heat transfer and dissipation via the thermal conductivity and phase transition heat transfer mechanism may improve the operations and/or operation life of the semiconductor transducer. For example, it may be possible to operate the cooler transducer at higher light intensity or higher electrical power without adverse impact on the performance and/or life of the transducer.

Reference now is made in detail to the examples illustrated in the accompanying drawings and discussed below. FIG. 1 is a cross-sectional view of a somewhat stylized example of an optical/electrical transducer apparatus 1, where the actual transducer is an active optical element 17 of or within a combined phase transition heat transfer mechanism. An active optical element converts energy from one form or another by an electrical process and/or an excitation state change process, where at least one form of the energy is optical, e.g. light. Active optical elements include optically driven elements, such as optically pumped phosphors and/or electrical devices driven by light to produce electricity, as well as electrical devices and/or phosphors driven by electricity or electrical/electromagnetic fields to produce light. In the example, the active optical element 17 is a semiconductor “transducer” for converting between light and electricity that, at least in part, uses semiconductor nanowires 19 to produce or respond to light. The nanowires 19 are also part of a wicking structure 15. By contrast, passive optical elements process and even change the character of light, but by optical processing only, that is to say without use of an electrical and/or excitation state change process. Examples of passive optical elements include windows, lenses, optical color filters, reflectors, gratings, diffusers, and the like.

The transducer apparatus 1 includes a housing 3. The housing 3 has at least one section that is thermally conductive. In the example of FIG. 1, the major section 5 of the housing 3 is formed of a thermally conductive material. Examples of suitable materials include metals, such as copper and aluminum, although other thermally conductive materials, such as thermally conductive plastics and ceramics, may be used to form the housing section 5. A portion of the housing section 5 will form a cold location 7, for example, acting as or coupled to a heat sink (not separately shown).

The housing 3 has a member 9 that is at least partially optically transmissive. The member 9 may be transparent or translucent or exhibit other transmissive characteristics (e.g. non-white color filtering), depending on the optical requirements of the particular application of the transducer apparatus 1. The material forming the member 9 may be any material of sufficient optical transmissivity and desired color characteristic for the particular application that is also able to withstand the expected operating temperatures of the transducer apparatus 1. Examples of suitable materials for the member 9 include various forms of glass, ceramics and plastics. The material for the member 9 may or may not need to be heat resistant, depending on the operating temperature at the hot location 7 maintained by operation of the thermal conductivity and phase transition heat transfer mechanism. The optically transmissive member 9 is connected to the housing section 5 to form a seal for a vapor tight chamber 11 enclosed by the thermally conductive housing section 5 and the optically transmissive member 9. The material of the member 9 is sufficiently transmissive to light, at least in the portion of the optical energy spectrum that is relevant to operations of the apparatus 1, so as to allow passage of optical energy into and/or out of the apparatus 1.

As noted, the optically transmissive member 9 is attached to the housing section 5 to form a seal for a vapor tight chamber 11. For example, if the optically transmissive member 9 is a glass or ceramic material and the housing section 5 is formed of a metal, the two elements may be joined by a glass frit process or by application of a suitable epoxy.

The exemplary apparatus 1 also includes a working fluid within the chamber 11. The pressure within the chamber 11, typically a pressure somewhat lower than atmospheric pressure, configures the working fluid to absorb heat during operation of the apparatus, to vaporize at a relatively hot location 13 as it absorbs heat, to transfer heat to and condense at the relatively cold location 7, and to return as a liquid to the relatively hot location. A variety of different fluids may be used as the working fluid, and the pressure is determined based on the fluid type and the amount of heat that the fluid is expected to transfer.

The working fluid, in its liquid state, contacts the hot interface at the location 13 where the apparatus receives or produces heat. In the example, heat is absorbed from surfaces of the semiconductor nanowires 19 of the transducer element 17. As the liquid absorbs the heat, it vaporizes. The vapor fills the otherwise empty volume of the chamber 11. Where the chamber wall is cool enough (the cold interface at location 7), the vapor releases heat to the wall of the chamber 11 and condenses back into a liquid. The drawing shows a central arrow from the hot location 13 toward the cold location 7. This arrow generally represents the flow of heat in the vapor state of the working fluid from the hot location 13 where the working fluid vaporizes toward the cold location 7 where the working fluid transfers heat for output via the thermally conductive housing section 5 and condenses back to the liquid form. The liquid form of the fluid flows back to the hot interface at location 13. The drawing shows arrows generally along the outer wall(s) of the housing from the relatively cold location 7 back to the relatively hot location 13. The arrows generally represent the flow of the condensed working fluid from the relatively cold location 7 back to the relatively hot location 13 where the fluid again vaporizes as it absorbs heat. In operation, the working fluid goes through this evaporation, condensation and return flow to form a repeating thermal cycle that effectively transfers the heat from the hot interface at location 13 to the cold interface at location 7.

The apparatus 1 thus is configured as a thermal conductivity and phase transition heat transfer mechanism, similar to many mechanisms which are sometimes referred to as "heat pipes." The thermal conductivity of the housing section 5 and the phase transition cycle through evaporation and condensation transfer heat from the hot location 13 to the cold location 7. Thermal conductivity at the cold interface allows heat transfer away from the mechanism, e.g. to a heat sink or to ambient air. Active cooling may also be provided. The configuration of the mechanism together with the degree of cooling determines the internal operating temperature. For example, the mechanism and a heat sink may support a maximum internal operating temperature around 50° C. Addition of active cooling or refrigeration at the cold interface may enable operation at a much lower internal temperature, such as 0° C.

The exemplary apparatus 1 also includes a wicking structure 15 mounted within the chamber 11 to facilitate flow of the condensed liquid of the working fluid from the cold location 7 to the hot location 13 of the mechanism 1. Capillary action or "wicking" relies on inter-molecular forces between a liquid and the surface(s) of a material around the liquid to cause movement of the liquid along or through the material. This action can overcome other forces on the liquid, such as gravity, to promote a desired movement of the liquid. In the thermal conductivity and phase transition heat transfer mechanism, the wicking structure 15 promotes movement of the condensed liquid back from the cold location 7 to the hot location 13.

The wicking structure 15 may take many forms, such as sintered metal, phosphor, glass or ceramic powder; woven copper; surface grooves, mesh arrangements or small closely spaced wires extending inward from the surfaces of the housing forming the walls of the chamber 11; as well as nano-scale wire structures extending inward from the chamber surface(s); and various combinations of these forms. The spacing between elements of the wicking structure 15 is sufficiently small to cause inter-molecular forces on the liquid form of the working fluid to cause the liquid to flow toward the region where the fluid vaporizes, that is to say, the hot location 13 in the apparatus 1. This wicking or capillary action enables the liquid form of the working fluid to flow back to the hot location 13 regardless of the orientation of (and thus the impact of gravity on fluid in) the heat transfer mechanism.

The apparatus 1 includes an active optical element 17. In this case, the active optical element is an optical/electrical transducer. The transducer 17 converts between optical and electrical energy. The present teachings apply to transducers 17 for emitting light in response to an electrical drive signal or for receiving and responding to light to produce an electrical signal. In the apparatus 1, light enters the apparatus through the optically transmissive member 9, for an optical-to-electrical conversion application to reach the transducer 17. For an electrical-to-optical conversion application, light produced by operation of the transducer 17 emerges from the apparatus 1 through the optically transmissive member 9.

If the apparatus 1 is cylindrical, then when viewed from either end, the apparatus 1 would appear circular. The member 9 could be circular or have other shapes, even in a cylindrical implementation of the apparatus 1. Those skilled in the art will appreciate that the lateral shapes of the mechanism as a whole and of the optically transmissive member may take other geometric forms, such as oval, rectangular or square, just to name a few examples.

The orientation in the drawing, in which light enters the apparatus 1 or is emitted from the apparatus 1 to the left in directions about a somewhat horizontal central axis, is shown only for purposes of illustration. Those skilled in the art will appreciate that the apparatus may be used in any other orientation that is desirable or suitable for any particular application of the transducer apparatus. Some implementations may utilize more than one optically transmissive member, to facilitate receipt or emission of light in additional directions. Although not shown, passive optical processing elements, such as diffusers, reflectors, lens and the like, may be coupled to the optically transmissive member to process light directed into the transducer apparatus 1 or to process light emitted from the transducer apparatus 1.

The examples discussed herein relate to transducers 17 that are formed at least in part by semiconductor nanowires 19, and in an apparatus like that of FIG. 1, the nanowires also serve as part of the wicking structure for purposes of promoting the liquid flow in the phase transition cycle of the heat transfer mechanism.

Hence, in the example of FIG. 1, the wicking structure 15 includes at least two different portions 19 and 21. The portion of the wicking structure 19 is formed of the semiconductor nanowires that also form at least part of the actual optical/electrical transducer 17 within the chamber 11. The semiconductor transducer 17 that includes the semiconductor nanowires 19 of the wicking structure 15 is configured to emit light through the optically transmissive member 9, and/or the semiconductor transducer 17 that includes the semiconductor nanowires 19 of the wicking structure is configured to be driven by light received via the optically transmissive member 9.

Figure 2:
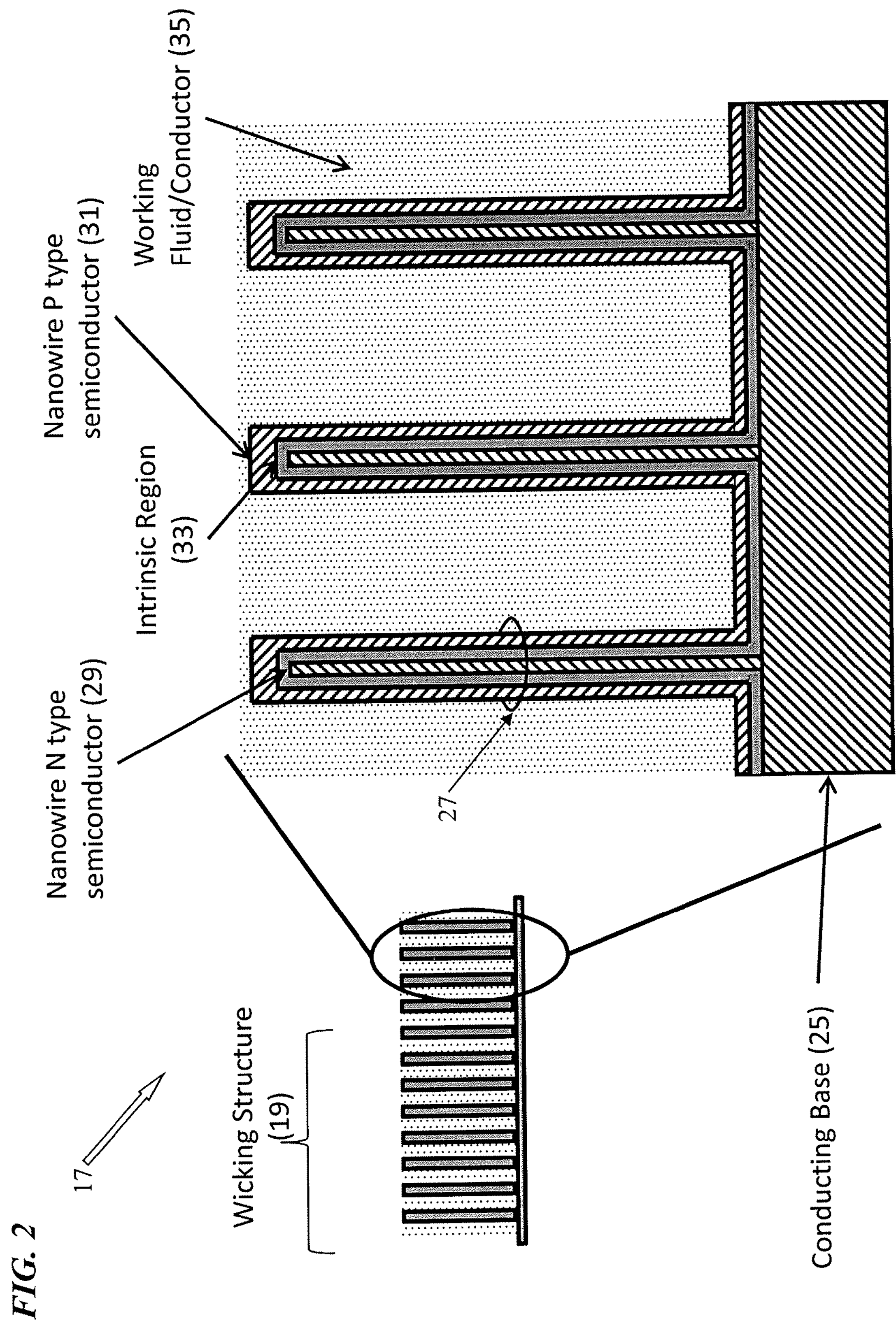
FIG. 2 is an enlarged detailed view of a portion of the semiconductor transducer in the apparatus of FIG. 1, including a number of the semiconductor nanowires.

FIG. 2 shows an example of a section of the optical/electrical transducer 17, utilizing the semiconductor nanowire portion 19 of the wicking structure. As discussed herein, applicable semiconductor light emitters essentially include any of a wide range light emitting or generating devices formed from organic or inorganic semiconductor materials. Similarly, the present discussion encompasses any of a wide range of sensors, photovoltaics or other transducers for producing an electrical signal in response to optical energy that may be formed from organic or inorganic semiconductor materials.

The active optical element, in this case the optical/electrical transducer 17, includes a conductive base 25. The base may be formed of an appropriate conductive material. For an arrangement like that of FIG. 1, where the transducer 17 is adjacent to the optically transmissive member 9, the conductive base 25 may also be optically transmissive. For example, the conductive base 25 can be formed of Indium Tin Oxide (ITO), other similar transparent conductive oxides, transparent conducting polymers, or layers consisting of transparent carbon nanotubes. The transparent conductive base 25 could form the optically transmissive member 9 of the apparatus housing 3, but in the example of FIGS. 1 and 2, the conductive base 25 is a separate element or layer on or adjacent to the optically transmissive member 9 of the apparatus housing 3. If ITO or another similar transparent conductive oxide is used, for example, the transparent conductive base 25 could take the form of a layer formed on a portion of the inner surface of the optically transmissive member 9. Although not separately shown, an electrical connection will be provided to the base 25, to provide one of the current path couplings to the semiconductor device of the actual transducer 17.

The transducer also includes nanowires 19 grown to extend out from the conductive base 25. Nanowires are wire-like structures having nano-scale cross-sectional dimensions. Although the cross-section of a nanowire may not be circular, it is often easiest to consider the lateral dimension of the nanowire to be a diameter. An individual nanowire 27 therefore may have an outer diameter measured in nanometers, e.g. in a range of approximately 1-500 nanometers. Hence, "nanowire" is meant to refer to any continuous wire or filament of indefinite length having an average effective diameter of nanometer (nm) dimensions. The "nanowire" term is therefore intended to refer to nanostructures of indefinite length, which may have a generally circular cross-sectional configuration or a non-circular cross-section (e.g. nanobelts having a generally rectangular cross-section).

Each individual semiconductor nanowire 27 in the example includes an inner nanowire 29 as a core and an outer nanowire 31. The inner and outer nanowires are doped with different materials so as to be of different semiconductor types. In the example, the inner nanowire 29 is an N type semiconductor, and the outer nanowire 31 is a P type semiconductor, although obviously, the types could be reversed. As a result of the semiconductor growth and doping processes, there is semiconductor junction or intrinsic region 33 formed between the two semiconductor type nanowires 29, 31. In the example, the material forming the intrinsic region and the P type semiconductor also extends over the inner surface(s) of the conductive base 25 between the N type inner nanowires 29. Those skilled in the art will recognize that the doping may be applied so as to essentially reverse the semiconductor types, e.g. so that the inner core nanowire 29 is a P type semiconductor and the outer nanowire 31 is an N type semiconductor.

Although not shown, reflectors may be provided at the distal ends (away from the base 25) of the semiconductor nanowires 27 to direct more of the light produced by the nanowire diodes back through the base 25 and the light transmissive member 9.

FIG. 2 also illustrates some of the working fluid 35 of the phase transition cycle of the heat transfer mechanism. The working fluid 35 directly contacts the outer surface(s) of at least the nanowires 27 of the semiconductor transducer, so that the fluid 35 may efficiently absorb heat from the transducer 17 during operation of the transducer. As noted, the conductive base 25 provides one of the electrical connections to the semiconductor nanowires 27, in this example, to the N type semiconductor inner nanowires 29. Although other types of electrical connections to the outer nanowires 31 could be provided, in the example of FIG. 2, the electrical connection to the P type semiconductor outer nanowires 31 is provided via the working fluid 35. To that end, the example uses a fluid 35 that is electrically conductive. Although not shown, the apparatus of FIG. 1 would include a conductive connection to the working fluid, for example, via a conductor connected to a metal forming the section 5 of the housing 3.

The semiconductor type optical/electrical transducer can provide conversion between optical and electrical energy or can provide conversion between electrical and optical energy. For an optical-to-electrical energy conversion, such as in a sensor or photovoltaic device, light energy applied to the semiconductor device produces a voltage across the P-N junction at the intrinsic region 33 of each nanowire 27, which allows a current to flow through a circuit via the conductive base 25 and the working fluid 35. For an electrical-to-optical energy conversion, the inner and outer nanowires together form a light emitting diode. A voltage is applied to produce a drive current through the diode, via the conductive base 25 and the working fluid 35. Application of a voltage at or above the diode turn-on threshold, across the P-N junction at the intrinsic region 33, causes each of each of the nanowires 27 to produce light.

The discussion of FIG. 2 focused on the semiconductor structure of the transducer 17 within the chamber 11 and the transducer operation. However, the nanowires 27 also form part of the wicking structure 15 of the combined phase transition and heat transfer mechanism. The spacing between the nanowires 27 is sufficiently small so as to facilitate capillary action on the working fluid 35, so that the nanowires 27 also function as portion 19 of the wicking structure 15 in the apparatus 1 of FIG. 1. Although the entire wicking structure 15 could be formed of semiconductor nanowires like the nanowires 27, the wicking structure 15 in our example also includes a somewhat different portion 21. The portion 21 of the wicking structure 15 may take many forms, as noted earlier, in this case, on the various inner surface of the section 5 of the housing 3.

Figure 3:
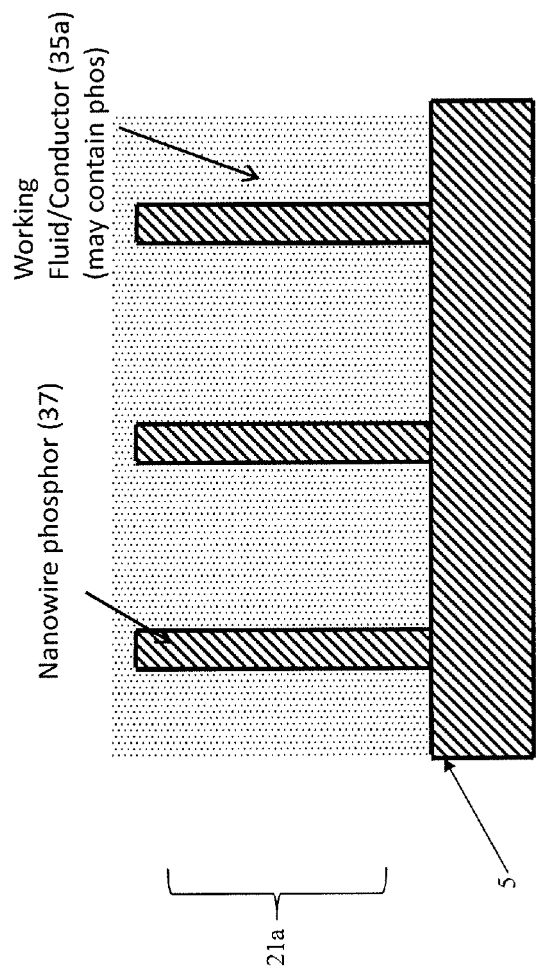
FIG. 3 is an enlarged detailed view of a portion of the thermally conductive part of the housing and associated part of the wicking structure, of the combined phase transition heat transfer mechanism of FIG. 1, showing phosphor bearing nanowires.
Figure 4:
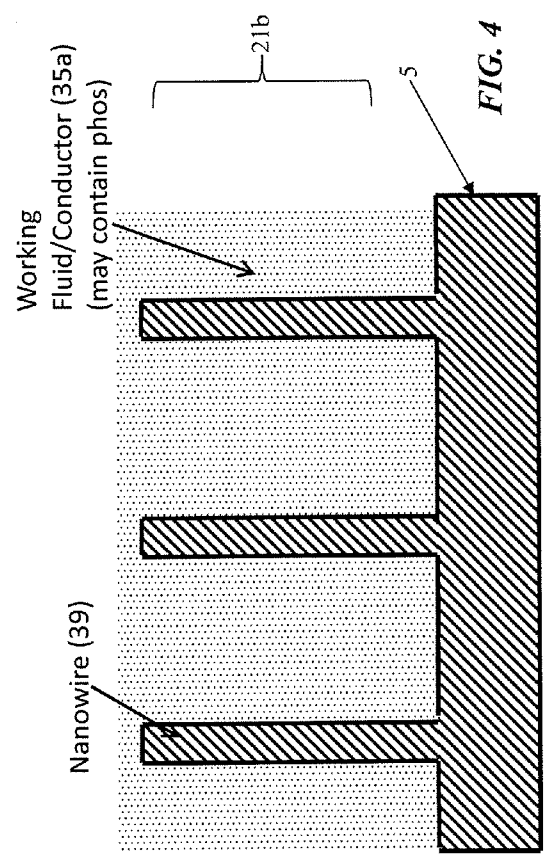
FIG. 4 is an enlarged detailed view of a portion of the thermally conductive part of the housing and associated part of the wicking structure, of the combined phase transition heat transfer mechanism of FIG. 1, showing metal nanowires.

FIGS. 3 and 4 show two specific examples of arrangements that may be used as some or the entire portion 21 of the wicking structure 15 in the transducer apparatus 1 of FIG. 1. The example of FIG. 3 uses a wicking arrangement 21*a* formed of nanowires 37. However, in the example of FIG. 3, the nanowires 37 are formed of an optically luminescent material such as a phosphor or phosphor bearing medium. The phosphor or medium may be grown as nanowires 37 extending inward into the interior of the chamber 11 from the inner surface of the section 5 of the housing 3. By way of an example, particles of suitable phosphor(s) may be dispersed in a polymer matrix, and the phosphor-polymer matrix is grown in the form of nanowires. Examples of suitable polymers include epoxies and silicon. A barrier layer of a few nanometers up to around a micron may be provided on the surface of the phosphor nanowires 37, so long at the barrier layer does not substantially impede flow of light to or from the phosphor or flow of heat from the excited phosphor to the fluid. The phosphor converts some of the optical energy within the chamber 11 from energy in one wavelength range (the excitation band of the phosphor) to another somewhat different wavelength range. There may or may not be some overlap of the excitation and emission spectra of the phosphor.

In an optical-to-electrical transducer application, the phosphor may convert some energy in a wavelength range that the semiconductor transducer can not process to a wavelength range that the semiconductor transducer can process or can at least process more efficiently. Converted light produced by the phosphor nanowires will eventually reach the semiconductor transducer within the chamber 11, and can then be processed more effectively by the transducer. Hence, the phosphor conversion may improve sensitivity of the transducer apparatus 1.

In an electrical-to-optical transducer application, the phosphor may convert some energy from the semiconductor light emitting transducer from a less desirable wavelength range (e.g. near or outside the visible spectrum) to a more desirable wavelength range (e.g. to fill-in a gap in the spectral characteristic of light produced by the emitter), to improve efficiency of the transducer apparatus 1 and/or to improve the quality of the light output. In the electrical-to-light type optical transducer application, the phosphor receives light emitted by the semiconductor transducer 17 that has not yet emerged from the apparatus 1 via the optically transmissive member 9. If in sections of the chamber 11 not at or near the member 9, the phosphor recycles such light and retransmits it within the chamber for eventual passage through the transparent conductive base 25 and the optically transmissive member 9.

Instead of a phosphor wicking structure as in FIG. 3, the example of FIG. 4 uses a metal nanowire wicking structure 21*b*. In the example of FIG. 4, metallic nanowires 39 of sufficient size and closeness to function as the wicking structure are grown so as to extend inward from the inner surface of the section 5 of the housing 3. In addition to supporting the capillary wicking function, the nanowires 39 may help support current flow to or from the conductive working fluid if the fluid is conductive. The nanowires 39 may also be reflective to reflect light within the chamber back to the transducer and/or the optically transmissive member 9, so as to improve recirculation of light within the chamber and thereby improve overall optical performance of the apparatus 1 of FIG. 1.

Although referred to as a phosphor, each nanowire may include one or more phosphors of different types where the mix of phosphors is chosen to promote a particular application of the apparatus 1. Another multi-phosphor approach might use a phosphor of one type in nanowires in one region of the chamber and a phosphor of another type in a different region of the chamber.

In both the examples of FIGS. 3 and 4, the working fluid may be conductive. Where an optical-luminescent function is desirable, the working fluid 35*a* may also be or include a phosphor or the like. If phosphor particles are contained in the fluid 35*a*, the particle surfaces may be exposed to the fluid or the particles may be encapsulated in a barrier layer of a few nanometers up to around a micron, so long at the barrier layer does not substantially impede flow of light to or from the phosphor or flow of heat from the excited phosphor to the fluid medium. The phosphor in the working fluid 35*a* may enhance certain aspects of the apparatus performance in a manner similar to that discussed above relative to the phosphor of the nanowires 37 in the example of FIG. 3.

The examples of FIGS. 3 and 4 relate to different nanowire arrangements for one or more portions of the wicking structure. In both cases, the size and spacing of the nanowires would be such as to provide a capillary flow of the liquid form of the working fluid. The working fluid 35 or 35*a* would directly contact the outer surface(s) of the respective nanowires.

As outlined above, the examples of FIGS. 3 and 4 may utilize an optically luminescent material such as a phosphor; and a number of the further examples discussed below likewise may utilize an optically luminescent material such as a phosphor. Terms relating to phosphor are intended to encompass a broad range of materials excited by optical energy of a first or 'excitation' band that re-generate light in a somewhat different second or 'emission' band. Examples of phosphors that may be used in various applications discussed herein include traditional phosphors, such as rare-earth phosphors, as well as semiconductor nanophosphors sometimes referred to as quantum dots or Q-dots and doped semiconductor nanophosphors. Those skilled in the art will also appreciate that phosphors of similar types and/or of different types, emitting light of different spectral characteristics, may be used in combination to facilitate particular transducer applications.

Figure 5:
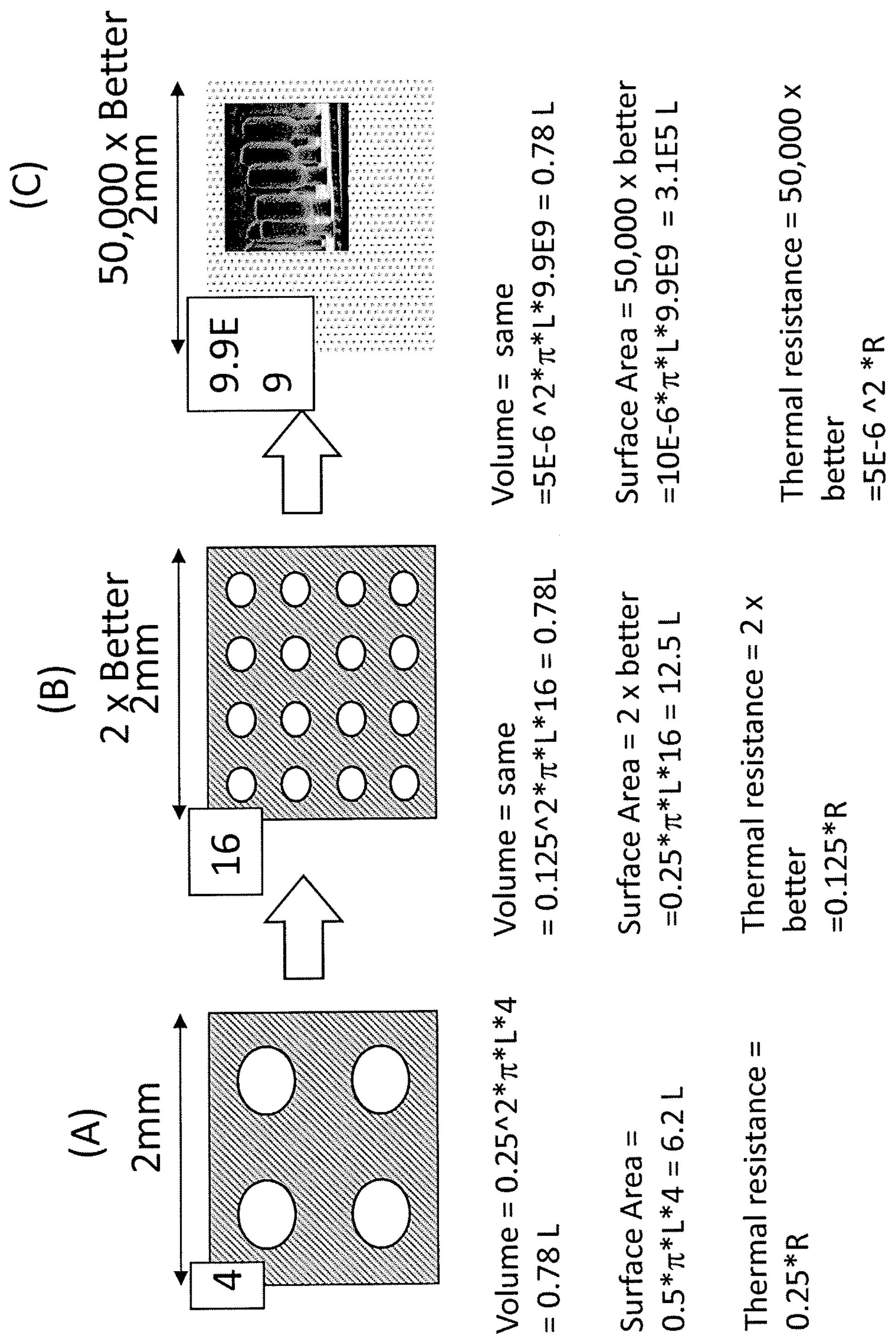
FIG. 5 is a comparative diagram useful in explaining how reducing the size and increasing the number of thermal elements per unit area increases the surface area for heat transfer and reduces the thermal resistance, and thus shows the advantages of using nanowires or similarly sized elements in the wicking structure of the thermal conductivity and phase transition heat transfer mechanism of an optical/electrical transducer apparatus.

The use of nanowires in the wicking structure, particularly on the semiconductor transducer 17 and/or or on the housing section 5 at the cold location 7, also improves heat transfer. In general, smaller more numerous heat transfer elements at these locations present increased surface area for heat transfer to/from the working fluid and therefore represent decreased thermal resistance. FIG. 5 is a comparative diagram useful in explaining how reducing the size and increasing the number of thermal elements per unit area of the housing wall increases total surface area for heat transfer and reduces the thermal resistance, both of which help to improve the rate of thermal transfer to/from the working fluid contacting the thermal transfer elements, in this case contacting the nanowires. It is believed that this comparison helps demonstrate and explain advantages of using nanowires or similarly sized elements in the wicking structure of the combined phase transition heat transfer mechanism of an optical/electrical transducer apparatus.

For discussion purposes, the square under each identifier (A), (B) and (C) represents a 2 mm×2 mm section of an inner surface of the vapor chamber of a thermal conductivity and phase transition heat transfer mechanism. However, the different examples (A), (B) and (C) have different sizes and numbers of heat transfer elements extending into the interior of the chamber. In the illustrated views, the heat transfer elements appear as circles, representing the end view (from inside the vapor chamber) of cylindrical heat transfer elements. Cylindrical shapes are used here for ease of modeling, although as noted earlier, other shapes may be used. For purposes of this comparison, we will assume that the heat transfer elements are all formed of the same material in each and every one of the three examples in FIG. 5.

The first example (A) has four pins of radius 0.25 mm (diameter of 0.5 mm). The length of the pins L need not be specified for comparison purposes. The number 4 in the formulae for the example is the number of pins. The volume of each pin is 2π times the radius-squared times the length (L) of the pins. As shown, the total volume of the material of the four pins is $0.25^2*2\pi*L*4$, which equals 0.78 L. For purposes of calculation of the surface area, we will use the outer cylindrical surface only (without including the end surfaces) to somewhat simplify the calculations for the comparison. With that approach, the surface area of a cylindrical pin is the diameter times π; times the length. Hence, the total cylindrical outer surface area presented by the four pins at (A) would be $0.5*\pi*L*4$, which equals 6.2 L. The thermal resistance of each pin equals the pin radius times the thermal resistance R of the material from which the pins are formed. In the example (A) in which the radius of the pins is 0.25 mm, the thermal resistance of each pin is 0.25*R.

The second example (B) has sixteen (16) pins of radius 0.125 mm (diameter of 0.250 mm) of the same length L as in the previous example. As shown, the total volume of the material of the sixteen pins is $0.125^2*2\pi*L*16$, which again equals 0.78 L. Again, using only the cylindrical surface area for purposes of comparison (without including the end surfaces), the total cylindrical outer surface area presented by the sixteen pins at (B) would be $0.25*\pi*L*16$, which equals 12.5 L. This decrease in size and increase in number of pins results in approximately doubling the surface area for heat transfer in comparison to example (A). The thermal resistance of each pin in example (B), equals 0.125*R, which is half the thermal resistance of example (A).

The use of nanowires in the wicking structure, particularly the semiconductor transducer 17 and/or or on the housing section 5 at the cold location 7, increases both the surface area for heat transfer and reduces the thermal resistance of each heat transfer element. Increased surface area and decreased thermal resistance both contribute to improved heat transfer. Example (C) in FIG. 5 represents a nanowire configuration in which the 2 mm×2 mm area of the chamber wall has $9.9\times10^{9}$ nanowires, where the radius of each nanowire is $5\times10^{-6}$ mm (5 nanometers) or the diameter of each nanowire is $10\times10^{-6}$ mm (10 nanometers).

As shown at (C), the total volume of the material of the nanowires is $(5\times10^{-6})^2*2\pi*L*(9.9\times10^{9})$, which again equals 0.78 L. Again, using only the cylindrical surface area for purposes of comparison (without including the end surfaces), the total cylindrical outer surface area presented by the nanowires at (C) would be $10\times10^{-6}*\pi*L*9.9\times10^{9}$, which equals $(3.1\times10^{5})$L, which is approximately 50,000 times more surface area for heat transfer than in first example (A). The thermal resistance of each nanowire in example (C), equals $(5\times10^{-6})*R$, which is approximately 50,000 times lower than the thermal resistance of example (A).

Hence, the use of nanowires in the wicking structure at various points in the exemplary transducer apparatuses discussed herein improves thermal transfer capabilities. At a hot location or interface, use of nanowires improves transfer of heat to the working fluid. At a cold location, use of nanowires improves transfer of heat from the working fluid to the cold interface, e.g. for transfer through the interface to a heat sink, active cooling element or ambient air.

The use of the nanowires also helps with the wicking action. As noted, inter-molecular forces between a liquid and the surface(s) of the wicking material around the liquid produce capillary action to move of the liquid form of the working fluid along or through the material. Increasing the surface area helps to increase the inter-molecular forces on the liquid form of the working fluid. Hence, use of nanowires as the wicking structure, with increased surface area as shown above, also increases the strength of the capillary action of the wicking structure on the liquid form of the working fluid.

As noted earlier, a variety of different fluids may be used as the working fluid. Different fluids are used in various transducer apparatus configurations to support the heat transfer function, and in many of the examples, to serve as a carrier for phosphor and/or as a conductor. For examples of the transducer apparatus that do not use the fluid as a carrier for phosphor or as a conductor, fluids commonly used in prior heat pipes and the like may be used, particularly if sufficiently transparent to allow any light passage that may be desirable in the particular apparatus configuration. For a working fluid that would carry semiconductor nano-phosphor as the phosphor, examples of suitable fluids include acetone, methanol, ethanol and toluene. If the nano-phosphor is well encapsulated, water may be on option. Toluene may be a preferred choice for many phosphors, however, for cooler internal working temperatures, ethanol me be preferred. For a working fluid that would carry rare-earth-phosphor, examples of suitable fluids include acetone, methanol ethanol and toluene, although here water may be a preferred choice. For a working fluid that is also electrically conductive, examples of suitable fluids include salt water, ammonia and fluids from the class of transparent ionic liquids.

Figure 6:
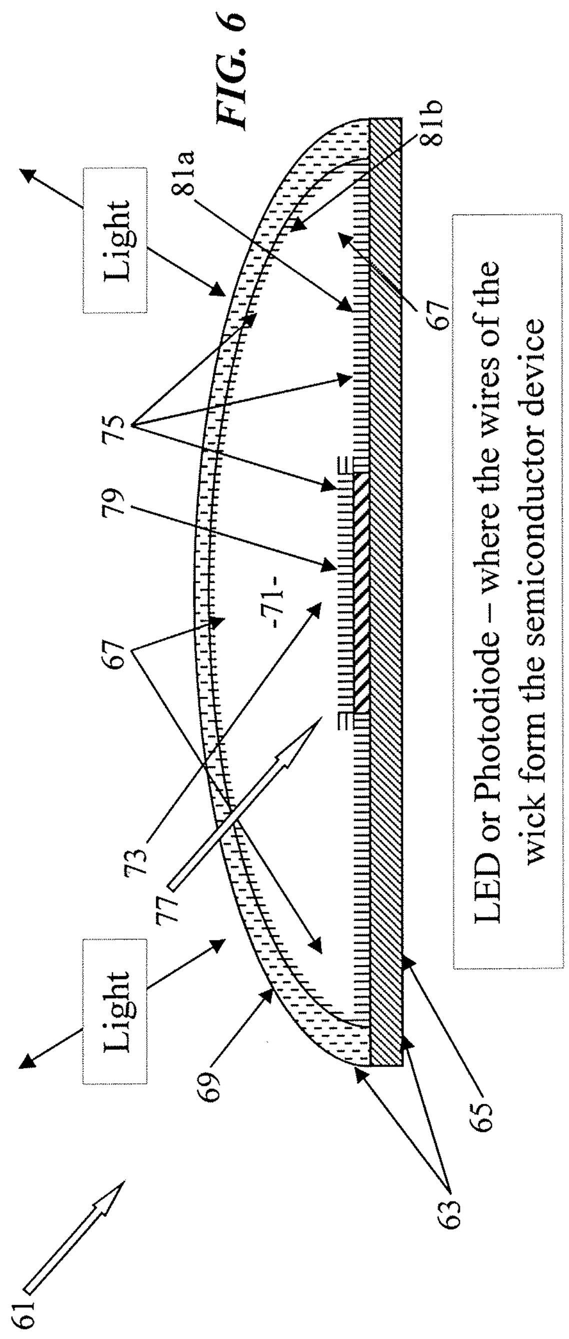
FIG. 6 is a cross-sectional view of an example of an optical/electrical transducer apparatus, where the semiconductor transducer, such as a LED or photodiode, utilizes semiconductor nanowires that also form a portion of the wicking structure.

FIG. 6 is a cross-sectional view of an example of an optical/electrical transducer apparatus 61, where the semiconductor transducer 77, such as a LED or a photodiode, utilizes semiconductor nanowires 79 that also form a portion of the wicking structure 75 of the thermal conductivity and phase transition heat transfer mechanism that is an integral part of the transducer apparatus 61.

The transducer apparatus 61 includes a housing 63. The housing 63 is formed of a metal section 65 and a light transmissive member 69. In this example, the metal section 65 supports the semiconductor transducer 77; and the light transmissive member 69 forms a curved cover or dome over but separated from the emitting portions of the semiconductor transducer 77. Viewed from above or below, the apparatus could be circular, oval, rectangular, square or the like. The metal of section 65 may be reflective, but it is not optically transmissive in this example. The optically transmissive member 69 of the housing 63 may be formed of a material that is also thermally conductive, although it may not be as thermally conductive as the metal of section 65.

The semiconductor transducer 77 is located at a roughly central area or region of the metal section 65, in this example, and a hot location 73 is formed in the area within the chamber where heat is produced by operation of a semiconductor transducer 77.

One or more portions of the member 69 and/or section 65 provide one or more relatively cold interfaces, similar to that at the cold location in the example of FIG. 1. Although the apparatus functions at various orientations, in the illustrated orientation, a cold interface or location would be formed at 67 along the surface of the curved optically transmissive member 69 of the housing 63, although there may be other cold locations 67 within the chamber. The materials of the housing section 65 and member 69 may be similar to those of the section 5 and the member 9 in the example of FIG. 1, although other suitable materials may be used.

As in the earlier example, the optically transmissive member or section 69 is attached to the housing section 65 to form a seal for a vapor tight chamber 71. For example, if the optically transmissive member or section 69 is a glass or ceramic material and the housing section 65 is formed of a metal, the two elements may be joined by a glass frit process or by application of a suitable epoxy.

The exemplary apparatus 61 also includes a working fluid within the chamber 71. Again, the pressure within the chamber 71, typically a pressure somewhat lower than atmospheric pressure, configures the working fluid to absorb heat during operation of the apparatus, to vaporize at the relatively hot location 73 as it absorbs heat from the transducer 77, to transfer heat to and condense at the relatively cold location(s) 67, and to return as a liquid to the relatively hot location 73. A variety of different fluids may be used as the working fluid, and the pressure is determined based on the fluid type and the amount of heat that the fluid is expected to transfer.

The working fluid, in its liquid state, contacts the hot interface at the location 73 where the apparatus receives or produces heat. For example, the working fluid directly contacts the outer surfaces of the nanowires 79. As the liquid absorbs the heat, it vaporizes. The vapor fills the otherwise empty volume of the chamber 71. Where the chamber wall is cool enough (the cold interface at one or more locations 67), the vapor releases heat to the wall of the chamber 71 and condenses back into a liquid. The liquid form of the fluid flows back to the hot interface at location 73. In operation, the working fluid goes through this evaporation, condensation and return flow to form a repeating thermal cycle that effectively transfers the heat from the hot interface to the cold interface.

Hence, as in the earlier example, the apparatus 61 is configured as a thermal conductivity and phase transition heat transfer mechanism. The thermal conductivity of the housing 63 and the phase transition cycle through evaporation and condensation transfer heat from the hot location 73 to the cold locations 67.

As noted, the exemplary apparatus 61 also includes a wicking structure 75 mounted within the chamber 71 to facilitate flow of condensed liquid of the working fluid from the cold locations 67 to the hot location 73 of the mechanism. The capillary action of the wicking structure 75 can overcome other forces on the liquid, such as gravity, to promote a desired movement of the liquid, regardless of the orientation of the optical/electrical transducer apparatus 61. The wicking structure may take many forms, as outlined in the discussion of the earlier examples.

As in the earlier example, the apparatus 61 includes a semiconductor type optical/electrical transducer 77 for converting between optical and electrical energy. The transducer in the example here is a diode, although the diode may be a light emitting diode or a photodiode. For an implementation using a photodiode form of the transducer 77, light enters the apparatus 61 through the optically transmissive member 69, impacts on the photodiode transducer 77 and causes the diode to generate a responsive electrical signal. For an electrical-to-optical conversion application, a drive current is applied to the light emitting diode of the transducer 17 causing it to generate light, which emerges from the apparatus 61 through the optically transmissive member 69.

The orientation in the drawing, in which light enters the apparatus 61 or is emitted from the apparatus 61 to/from directions above the horizontal plane, is shown only for purposes of illustration. Those skilled in the art will appreciate that the apparatus 61 may be used in any other orientation that is desirable or suitable for any particular application of the transducer apparatus. As in the earlier example, optical processing elements (not shown), such as diffusers, reflectors, lens and the like, may be coupled to the optically transmissive member 69 to process light directed into the transducer apparatus 61 or to process light emitted from the transducer apparatus 61.

The transducer 77 may be formed in a manner similar to that of the transducer 17 in the examples of FIGS. 1 and 2, e.g. in the form of a conductive base with a semiconductor structure formed on the conductive base. The semiconductor structure in turn includes semiconductor nanowires, in the example of FIG. 6, nanowires 79. In this example, the conductive base can be a metal or an appropriately doped semiconductive material. Unlike the earlier example of FIG. 2, the conductive base need not be transparent.

A first electrical connection path to the semiconductor structure of the transducer 77 is provided via the conductive base. The outer surfaces of the semiconductor structure of the transducer 77, including the outer surfaces of the semiconductor nanowires 79, can be coated with a transparent conductor like one of those discussed earlier, in this case, to provide a second electrical connection path to the semiconductor structure of the transducer 77. Alternatively, the second electrical connection path can be provided via the working fluid, in which case, the working fluid is a conductive fluid.

As in the example of FIG. 1, in the apparatus 61 of FIG. 6, the semiconductor nanowires 79 of the optical/electrical transducer 77 also serve as part of the wicking structure 75 for purposes of promoting the liquid flow in the phase transition cycle of the heat transfer mechanism.

In addition to the semiconductor nanowire portion 79, the wicking structure 75 includes one on more portions 81 formed on inner surfaces of the chamber wall(s) formed by the section 65 and the optically transmissive member 69. The portions 81 of the wicking structure formed on the section 65 and the optically transmissive member 69 could be the same or different kinds of structures. The wicking structure in portions 81 may take many forms, such as sintered metal, phosphor, glass or ceramic powder; woven copper; surface grooves, mesh arrangements or small closely spaced wires extending inward from the surfaces of the housing forming the walls of the chamber; as well as nano-scale wire structures extending inward from the chamber surface(s); and various combinations of these forms.

In the example, however, the portions 81 formed on inner surfaces of the chamber wall formed by the section 65 and the optically transmissive member 69 consist of nanowires formed on the appropriate surfaces. The nanowire wicking structures on the section 65 and the optically transmissive member 69 may be the same, e.g. similar to one of the structures discussed above relative to FIGS. 2 and 3. In the example of FIG. 6, however, a first type of nanowire arrangement is provided for the portion 81*a* of the wicking structure on the metal housing section 25, and a different type of nanowire arrangement is provided for the portion 81*b* of the wicking structure on the optically transmissive member 69. For example, the first type of nanowire arrangement is provided for the portion 81*a* of the wicking structure on the metal housing section 25 may be a reflective metallic nanowire configuration as in part of the discussion of FIG. 4 above. The second type of nanowire arrangement provided for the portion 81*b* of the wicking structure on the optically transmissive member 69 may be optically transmissive, although it may also contain a phosphor component for conversion of some of the light passing through the member 69 as discussed earlier relative to FIG. 3. Phosphor may also be provided in the working fluid, if useful to support a particular application of the transducer apparatus 61.

The number and size of the nanowires in the various sections 79, 81*a* and 81*b* would be chosen to promote the desired capillary action as well as to achieve a degree of heat transfer appropriate for the particular transducer design.

For purposes of discussion of a first application of a transducer apparatus 61, assume for now that the transducer apparatus 61 emits light, e.g. the transducer 77 is a LED. A substantial portion light emitted from the LED type transducer 77 is directed toward the optically transmissive member 69. As it reaches the inner surface of the optically transmissive member 69, some of that light excites phosphor(s) in the phosphor nanowires in the portion 81*b* of the wicking structure on the optically transmissive member 69. The excited phosphors re-emit light of a different spectral characteristic, e.g. at a wavelength different from the excitation light. If provided, phosphor(s) in the working fluid may be similarly excited to produce light of an additional spectral characteristic. Output light of the apparatus 61 includes a combination of light directly emitted by the LED type transducer 77 and light produced by phosphor excitation. The use of phosphors may shift light from a wavelength region that does not substantially contribute to the intended application into a more desirable/useful wavelength region, e.g. from ultraviolet (UV) or near UV up into the more desirable visible part of the spectrum. This may improve efficiency or efficacy of the overall light output of the apparatus 61.

In the light emitting application of a transducer apparatus 61, some light emitted by the LED type transducer 77 is directed toward the metal section 65. If phosphors are provided in the wicking structure and/or the working fluid, then some of the light produced by phosphor excitation also is directed toward the metal section 65. The metal of the section 65 may be reflective, to redirect such light for output via the optically transmissive member 69. However, in the example, much of the inner surface of the metal section 65 is covered by the portion 81*a* of the wicking structure formed of reflective metallic nanowires. Hence, the metal nanowires of the portion 81*a* redirect light for output via the optically transmissive member 69.

Much like the example of FIGS. 1-3, the arrangement of FIG. 6 is also suitable for use in a sensor or photovoltaic application in which the transducer 77 is a photodiode. The optical-to-electrical application would function essentially in reverse of the preceding discussion of the electrical-to-optical emitter application. For example, light entering via the member 69 would be processed by phosphors (if provided) and/or reflected. Then, upon impact on the photodiode type transducer 77, the light would cause the transducer 77 to generate electricity as the light responsive output of the apparatus 61.

FIG. 7 is a top view, and FIG. 8 is an isometric view, of a device or light engine for emitting light. The illustrated device 101 could be used as a light engine of a light fixture, although the exemplary configuration is particularly configured for use in a lamp or 'light bulb,' for example, in combination with a transparent, translucent or colored transmissive globe (not shown).

As in the earlier examples, the light emitting device 101 may operate at any orientation, although a particular orientation is illustrated for convenience. Some aspects of the following description of the light emitting device 101 use directional terms corresponding to the illustrated orientation, for convenience only. Such directional terms may help with understanding of this description of the example of FIGS. 7-9 but are not intended to be limiting in any way.

The light emitting device 101 includes a light emitting transducer apparatus that is integrated with a thermal conductivity and phase transition heat transfer mechanism, represented together as one integral element 103 in the drawings. Heat is transferred from the apparatus 103 to a heat sink 105. The heat sink 105 is formed of a highly thermally conductive material, typically a metal such as copper or aluminum, although other materials, such as thermally conductive plastics and ceramics, may be used. The heat sink 105 in our example has a core 107 having a central passage, a wall of which forms a fairly tight structural and thermal connection to the outer surface of a portion of the housing of the apparatus 103. The rest of the apparatus 103 extends upward or away from the passage in the core 107 of the heat sink 105, to form a pedestal or the like with a light emitting diode at or near the distal end. Extending radially outward from the core 107, the heat sink 105 has a number of fins 109 for radiating heat to the ambient atmosphere. Straight radial fins are shown, for convenience, although other shapes/contours may be used, e.g. to promote heat transfer and/or to allow a desired amount of light from the emitter and phosphor to pass down between the fins.

FIG. 9A is a cross-sectional view taken along line A-A of FIG. 7, and FIG. 9B is an enlarged detail view of a portion of the optical/electrical transducer apparatus 103 and heat sink 105 corresponding to that encircled by the arrow B-B in FIG. 9A. As illustrated, the light emitting device 101 includes a housing having a section 113 that is thermally conductive and a member 115 that is at least partially optically transmissive. In this example, the thermally conductive section 113 consists of a hollow copper cylinder or tube having a circular cross-section. A substantial portion of the copper section 113 of the housing extends down into the passage through the core 107 of the heat sink 105. The copper section 113 may be press fitted into the passage or be otherwise connected and thermally coupled to the heat sink 105 in any appropriate manner suitable for efficient heat transfer and to provide structural support that may be necessary for the apparatus 103. The end of the copper cylinder or tube of section 113 opposite the optically transmissive member 115 is closed, e.g. by a flat circular section of copper.

In this example, the optically transmissive member 115 consists of a hollow glass cylinder or tube having a circular cross-section and closed at one end by a curved or dome-shaped section of the glass. The cylindrical thermally conductive section 113 and the optically transmissive member 115 have approximately the same lateral dimensions so as to form a relatively straight continuous cylinder, although other lateral and cross-sectional shapes could be used. For example, one or both of the elements 113, 115 could vary in shape and/or dimension along the lateral length of the light emitting transducer apparatus 103, e.g. so that the region away from the heat sink 105 is somewhat enlarged or bulbous at the end of the pedestal. Also, the distal end of the optically transmissive member 115 (furthest away from the heat sink 105) could have other shapes, e.g. to be flat or concave instead of the illustrated dome shape.

The glass optically transmissive member 115 is connected to the copper thermally conductive section 113 of the light emitting transducer apparatus 103 to form a housing enclosing a vapor chamber and a semiconductor light emitting device. Specifically, the section 113 and member 115 are connected so as to form a vapor tight seal for the chamber. The two elements may be joined by a glass frit process or by application of a suitable epoxy, at the glass/copper interface.

Glass and copper are given by way of examples of the materials of the optically transmissive member 115 and the thermally conductive section 113. Those skilled in the art will appreciate that other optically transmissive materials and thermally conductive materials may be used.

The semiconductor light emitting device in this example includes semiconductor nanowires forming a light emitting diode (LED) 117, within the chamber. In this example, the semiconductor nanowires forming the LED 117 are formed or mounted on the curved interior surface at the distal end of the optically transmissive member 115. The structure of the LED 117 with the nanowires may be similar to the transducer device discussed above relative to FIG. 2. As noted at one point in the discussion of FIG. 2, reflectors may be provided at the distal (inner most) ends of the nanowires of the LED device 117, to increase output of light from the LED through the dome of the glass member 115. Since the LED 117 is mounted on glass, one or both electrical connections to the LED may be provided by separate leads (two of which are shown in the drawing), in which case, the working fluid need not be conductive.

The glass forming the optically transmissive member 115 may be transparent or translucent or exhibit other transmissive characteristics (e.g. non-white color filtering), depending on the application for the device 101. The glass of the member 115 permits emission of at least some light from the LED 117 as an output of the light emitting device 101.

For purposes of operating as a thermal conductivity and phase transition heat transfer mechanism, the light emitting device 101 also includes a working fluid within the chamber. The working fluid directly contacts the outer surfaces of the nanowires of the LED 117. The pressure within the chamber configures the working fluid to absorb heat from the LED 117, particularly from the nanowires, during operation of the device 101. The fluid vaporizes at a relatively hot location at or near the semiconductor nanowires of the LED 117 as the working fluid absorbs heat. The vapor transfers heat to and condenses at a relatively cold location of the copper section 113 in contact with the heat sink 105, and the condensed working fluid returns as a liquid to the relatively hot location at or around the LED 117.

As in the earlier examples, the device 101 of FIG. 7 includes a wicking structure mounted within the chamber to facilitate flow of condensed liquid of the working fluid from the cold location to the hot location. Together, the housing, the chamber, the working fluid and the wicking structure form a thermal conductivity and phase transition heat transfer mechanism for transferring heat away from the LED 117, in this case, to the heat sink 105. The semiconductor nanowires of LED 117 on the inner curved surface of the glass member 115 are configured to serve as a portion of the wicking structure.

In addition to the nanowires of the LED 117, the wicking structure includes a non-LED (not semiconductor nanowires) wick 121 formed on the portions of the inner surface of the glass member 115 in regions other than the region(s) covered by the structure of the LED 117. The overall wicking structure further includes a non-LED (not semiconductor nanowires) wick 123 on the inner surface of the copper section 113. The wicks 121 and 123 may take many forms, such as sintered metal, phosphor, glass or ceramic powder; woven copper; surface grooves, mesh arrangements or small closely spaced wires extending inward from the surfaces of the housing forming the walls of the chamber; as well as nano-scale wire structures extending inward from the chamber surface(s); and various combinations of these forms. The wicks may be similar to each other or different, e.g. as discussed above relative to the example of FIG. 6. In the example of FIGS. 7-9, the wick in the glass member 115 may be formed of a material that is at least somewhat optically transmissive, whereas the wick in the copper section 113 may be at least somewhat reflective.

Depending on the application of the light emitting device 101 and/or the light output properties of the LED, the device 101 may or may not include a phosphor or other luminescent material. In the present example, however, the light emitting device 101 does include a phosphor. As outlined earlier, the phosphor may be provided in some or all of the wicking structure. In the example of FIGS. 9A and 9B, the phosphor is provided in the form of a layer 125 between the LED 117 and the curved interior surface at the distal end of the optically transmissive member 115 on which the LED is mounted. Light emerging from the LED 117 toward the curved interior surface of the optically transmissive member 115 passes through the phosphor layer 125. Some of the light excites the phosphor, and the excited phosphor converts optical energy from the LED 117 from energy in one wavelength range (the excitation band of the phosphor) to another wavelength range. For example, the phosphor 125 may convert some energy from the LED 117 from a less desirable wavelength range (e.g. near or outside the visible spectrum) to a more desirable wavelength range (e.g. to fill-in a gap in the spectral characteristic of light produced by the emitter), to improve efficiency of the light emitting device 101 and/or to improve the quality of the light output.

The phosphor layer may include one type of phosphor or phosphor of a number of types, depending on the desired characteristics of the light output of the device 101. Also, the phosphor layer may extend down the inner surface of the housing, e.g. down the inner cylindrical surface of the glass member 115 to the glass/copper interface. Additional phosphor may be provided in the working fluid.

FIG. 10 is a top view, and FIG. 11 is an isometric view of another device or light engine 101' for emitting light. FIG. 12A is a cross section view taken along line A-A of FIG. 10, and FIG. 12B is an enlarged detail view of a portion of the optical/electrical transducer apparatus and heat sink of FIG. 12A, showing the addition of a phosphor layer. The device or light engine 101' is generally similar to the device 101 of FIGS. 7-9, like reference numerals identify corresponding elements, and the discussion above can be referenced for detailed information about the corresponding elements. The device 101' does include a phosphor. However, instead of including the phosphor as a layer between the light emitting diode and the surface of the optically transmissive member 115, the phosphor in the device 101' is carried by the working fluid 125'. A phosphor bearing working fluid as may be used in the device 101' has been discussed earlier with regard to the examples of FIGS. 3 and 4.

FIGS. 7-12 and the descriptions thereof relate to light emitting devices 101, 101'. The present teachings are also applicable to transducers that convert optical energy into electrical energy. To appreciate such additional applicability, it may be helpful to consider a specific example of an optical-to-electrical transducer, with reference to FIGS. 13-15.

Figure 13:
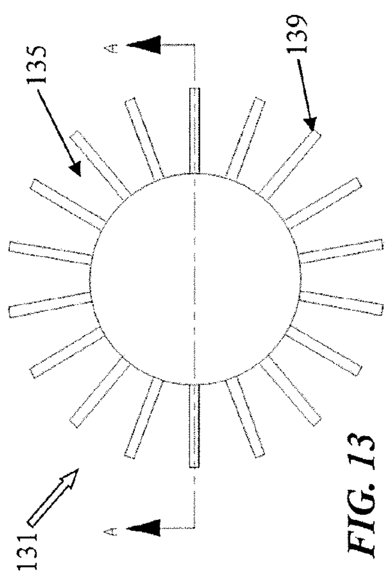
FIGS. 13 and 14 are top and isometric views of a light receiving type optical/electrical transducer apparatus, a heat sink and a light concentrator, as may be used in for a sensor or photovoltaic apparatus.
Figure 14:
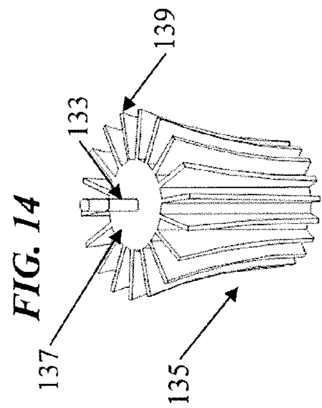

FIG. 13 is a top view, and FIG. 14 is an isometric view, of a device 131 for producing an electrical signal in response to light. The device 131 may be configured as an optical energy sensor or detector, e.g. for UV, visible light, infrared, or the like; and/or the device 131 may be configured as a photovoltaic device for generating power in response to optical energy in a desired spectral range. Although not shown, an optically transmissive outer element such as a globe may be added as a cover or the like.

As in the earlier examples, the light responsive transducer device 131 may operate at any orientation, although a particular orientation is illustrated for convenience. Some aspects of the following description of the light transducer device 131 use directional terms corresponding to the illustrated orientation, for convenience only. Such directional terms may help with understanding of this description of the example of FIGS. 13-15 but are not intended to be limiting in any way.

The device 131 includes a light responsive transducer apparatus (including the actual semiconductor transducer, such as a photodiode) that is integrated with a thermal conductivity and phase transition heat transfer mechanism, represented together as one integral element 133 in the drawings. Heat is transferred from the apparatus 133 to a heat sink 135. The heat sink 135 is formed of a highly thermally conductive material, typically a metal such as copper or aluminum, although other materials, such as thermally conductive plastics and ceramics, may be used. The heat sink 135 in our example has a core 137 having a central passage, a wall of which forms a fairly tight structural and thermal connection to the outer surface of a portion of the housing of the apparatus 133. The rest of the apparatus 133 extends upward or away from the passage in the core 137 of the heat sink 135, to form a pedestal or the like with the photodiode or the like at or near the distal end. Extending radially outward from the core 137, the heat sink 135 has a number of fins 139 for radiating heat to the ambient atmosphere.

Figure 15A:
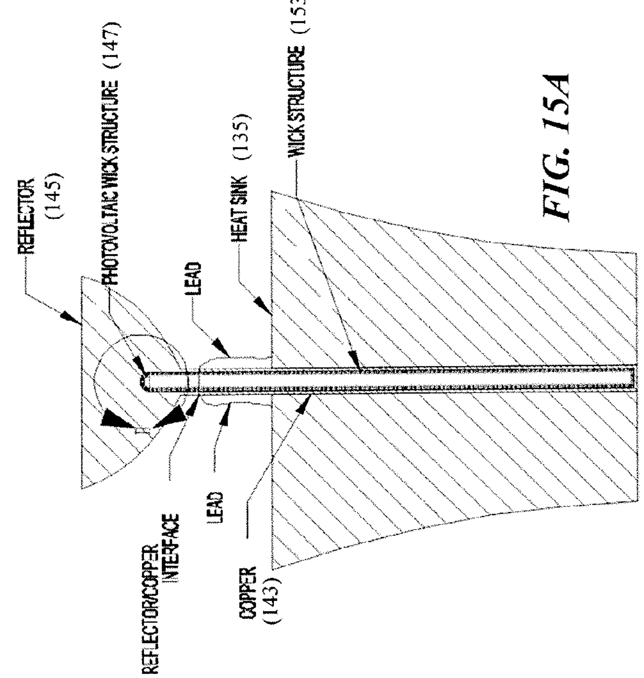
FIG. 15A is a cross-sectional view taken along line A-A of FIG. 13.
Figure 15B:
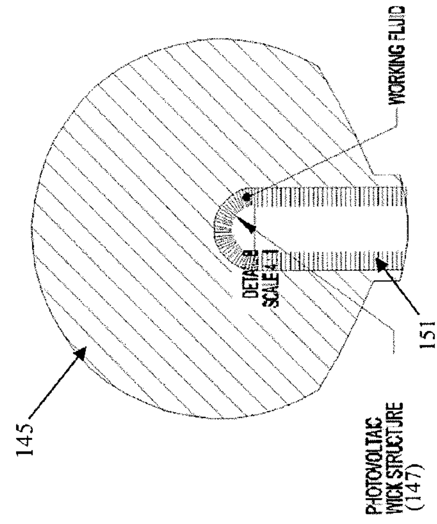
FIG. 15B is an enlarged detail view of a portion of the optical/electrical transducer apparatus and heat sink of FIG. 15A.

FIG. 15A is a cross-sectional view taken along line A-A of FIG. 13, and FIG. 15B is an enlarged detail view of a portion of the optical/electrical transducer apparatus 133 and heat sink 135 corresponding to that encircled by the arrow B-B in FIG. 15A. As illustrated, the light responsive transducer device 131 includes a housing having a section 143 that is thermally conductive and a member 145 that is at least partially optically transmissive.

In the example of FIGS. 15A, 15B, the member 145 is a curved glass element having an inwardly reflective outer surface to form a reflector with respect to the transducer. Various curvatures may be used to concentrate incoming light at the location of the actual semiconductor transducer 147. Reflectivity can be provided by a coating or other surface treatment at the curved outer surface of the glass member 145 or possibly by total internal reflection of a substantial portion of the incident light.

A separate member could be used as the optically transmissive member as in the examples of FIGS. 7-12 and as shown in the FIG. 14. In such a case, the reflector would be fitted over the glass member, and the reflector may be solid as shown or may be an open reflector. However, the reflector is omitted from the isometric view of FIG. 14, for convenience, to more clearly show the portion of the apparatus 133 extending above the heat sink 135.

In the examples of FIGS. 15A, 15B with the solid reflector 145, a hollowed portion of the glass forms a portion of the housing of the transducer apparatus 133 with the integral thermal conductivity and phase transition heat transfer mechanism. Stated another way, in this example, the glass of the reflector 145 also serves as the optically transmissive member of the housing. It should be noted that the detail view of FIG. 15B represents only the portion of the reflector/member 145 encircled by the arrow B-B and does not show the entire reflector 145 (compare to FIG. 15A).

The thermally conductive section 143 consists of a hollow copper cylinder or tube having a circular cross-section. A substantial portion of the copper section 143 of the housing extends down into the passage through the core 137 of the heat sink 135. The copper section 143 may be press fitted into the passage or be otherwise connected and thermally coupled to the heat sink 135 in any appropriate manner suitable for efficient heat transfer and to provide structural support that may be necessary for the apparatus 133. The end of the copper cylinder or tube of section 143 opposite the optically transmissive member 145 is closed, e.g. by a flat circular section of copper.

In this example, the optically transmissive member 145 consists of a hollow cylinder or tube formed within the glass of the reflector 145. The hollow section has a circular cross-section and is closed at one end by a curved or dome-shaped contour within the glass. The interior of the cylindrical thermally conductive section 143 and the hollow within the optically transmissive member/reflector 145 have approximately the same lateral dimensions so as to form a relatively straight continuous cylindrical volume for the vapor chamber within the housing. As in the examples of FIGS. 7-12, other lateral and longitudinal shapes may be used for either or both of the section 143 and the interior volume of the glass member 145.

The glass optically transmissive member 145 is connected to the copper thermally conductive section 143 of the light emitting transducer apparatus 133 to form a housing enclosing a vapor chamber and a light responsive semiconductor transducer. Specifically, the section 143 and member 143 are connected so as to form a vapor tight seal for the chamber. The two elements may be joined by a glass frit process or by application of a suitable epoxy, at the glass/copper interface.

Glass and copper are given by way of examples of the materials of the optically transmissive member 145 and the thermally conductive section 143. Those skilled in the art will appreciate that other optically transmissive materials and thermally conductive materials may be used.

The apparatus 133 includes a semiconductor transducer that generates an electrical signal in response to light. As shown at 147, the semiconductor transducer is formed so as to include semiconductor nanowires. The semiconductor transducer may take and of a number of different forms, although for purposes of further discussion, we will assume that the semiconductor transducer 147 is configured as a photovoltaic or the like.

The glass forming the optically transmissive portion of the reflector 145 may be transparent or translucent or exhibit other transmissive characteristics (e.g. non-white color filtering), depending on the photovoltaic or sensor application for the device 131. The glass of the member 145 permits light directed toward the reflector/member to pass through to the photo voltaic device 147 as an input of the light responsive transducer device 131. Light impacting on the reflective portion of the member 145 is reflected back through the glass for concentration at the position of the photovoltaic 147.

As discussed above, the device 131 includes a housing having a section 143 that is thermally conductive and a member 145 that is at least partially optically transmissive; and together, the housing section 143 and the optically transmissive member form a vapor chamber containing the working fluid for the integral thermal conductivity and phase transition heat transfer mechanism.

In this example, the semiconductor nanowires forming the photovoltaic 147 are formed or mounted on the curved interior surface at the distal end of the cavity within the optically transmissive member 145. The structure of the photovoltaic 147 with the nanowires may be similar to the transducer device discussed above relative to FIG. 2. As noted in earlier discussions, reflectors may be provided at distal ends of the nanowires, in this case to reduce the amount of light that escapes past the photovoltaic into the rest of the chamber and thus increase the amount of light processed by the photovoltaic 147. Since the photovoltaic 147 is mounted on glass, one or both electrical connections to the photovoltaic may be provided by separate leads (two of which are shown in the drawing), in which case, the working fluid need not be conductive.

For purposes of operating as a thermal conductivity and phase transition heat transfer mechanism, the light emitting device 131 also includes a working fluid within the chamber. The working fluid directly contacts the outer surfaces of the nanowires of the photovoltaic 147. The pressure within the chamber configures the working fluid to absorb heat from the photovoltaic, particularly from the nanowires, during operation of the device 131, to vaporize at a relatively hot location at or near the semiconductor nanowires of the photovoltaic 147 as the working fluid absorbs heat. The vapor transfers heat to and condenses at a relatively cold location of the copper section 143 in contact with the heat sink 135, and the condensed working fluid returns as a liquid to the relatively hot location at or around the photovoltaic 147.

As in the earlier examples, the device 131 of FIGS. 13-15 includes a wicking structure mounted within the chamber to facilitate flow of condensed liquid of the working fluid from the cold location to the hot location. Together, the housing, the chamber, the working fluid and the wicking structure form a thermal conductivity and phase transition heat transfer mechanism for transferring heat away from the photovoltaic 147. The semiconductor nanowires of photovoltaic 147 on the inner curved surface of the glass member 145 are configured to serve as a portion of the wicking structure.

In addition to the nanowires of the photovoltaic 147, the wicking structure includes a wick 151 formed of non-semiconductor nanowires on the portions of the inner surface of the glass member 145 in regions other than the region(s) covered by the structure of the photovoltaic 147. The overall wicking structure further includes a wick 153 formed of non-semiconductor nanowires on the inner surface of the copper section 143. Although formed of nanowires in the example, the wicks 151 and 153 may take many forms, such as sintered metal, phosphor, glass or ceramic powder; woven copper; surface grooves, mesh arrangements or small closely spaced wires extending inward from the surfaces of the housing forming the walls of the chamber; as well as nano-scale wire structures extending inward from the chamber surface(s); and various combinations of these forms. The wicks may be similar to each other or different, e.g. as discussed above relative to the earlier examples. In the example of FIGS. 13-15, the wick in the glass member 145 may be formed of a material that is at least somewhat optically transmissive, whereas the wick in the copper section 143 may be at least somewhat reflective.

The example of FIGS. 13-15 does not include a phosphor. However, some sensor or photovoltaic applications of the apparatus 131 may include a phosphor. If useful, a phosphor appropriate to the application could be included in any of the various ways discussed above with regard to earlier examples.

Those skilled in the art will appreciate that the teachings above may be applied in a variety of different ways and are not limited to the specific structures, materials and arrangements shown in the drawings and described above. For example, the instructed devices include one transducer with the nanowires forming part of the wick within the chamber of the thermal conductivity and phase transition heat transfer mechanism. It is contemplated that a single device or apparatus may include multiple transducers with the nanowires of the transducers forming part of the wick. In a device having multiple semiconductor transducers, the transducers may be substantially similar, e.g. to emit or sense the same type of light. Alternatively, different transducers in one device may serve multiple purposes. For example, one semiconductor transducer might be configured to sense or emit light of a first spectral characteristic, whereas another semiconductor transducer might be configured to sense or emit light of a different second spectral characteristic. In another example of a multi-transducer arrangement, one semiconductor transducer might be configured to sense or emit light and another semiconductor transducer might be configured as a sensor of light or temperature.

It should be apparent from the discussion above that when an element is referred to as being “on”, “attached” to, “connected” to, “coupled” with, “contacting,” etc., another element, it can be directly on, attached to, connected to, coupled with or contacting the other element or intervening elements or spacing may also be present. In contrast, when an element is referred to as being, for example, “directly on”, “directly attached” to, “directly connected” to, “directly coupled” with or “directly contacting” another element, there are no intervening elements present, although in some cases there may be intervening elements or layers of up to a micron or so, so long as such layers or elements do no substantially reduce thermal conductivity. It will also be appreciated by those of skill in the art that references to a structure or feature that is disposed “adjacent” another feature may have portions that are nearby or even overlap or underlie the adjacent feature.

Similarly, spatially relative terms, such as “under,” “below,” “lower,” “over,” “upper” related orientation or directional terms and the like, that may have been used above for ease of description to describe one element or feature’s relationship to another element(s) or feature(s) orientation or direction as illustrated in the figures. It will be understood that the spatially relative terms are intended to encompass different orientations of the device in use or operation in addition to the orientation depicted in the figures. For example, if the device in the figures is inverted, elements described as “under” or “beneath” other elements or features would then be oriented “over” the other elements or features.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. An optical/electrical transducer apparatus, comprising:
- a housing having a section that is thermally conductive and a member that is at least partially optically transmissive, the optically transmissive member being connected to the thermally conductive section of the housing to form a seal for a vapor tight chamber;
- a working fluid within the chamber, wherein pressure within the chamber configures the working fluid to absorb heat during operation of the apparatus, to vaporize at a relatively hot location as the working fluid absorbs heat, to transfer heat to and condense at a relatively cold location, and to return as a liquid to the relatively hot location; and
- a wicking structure in contact with the working fluid comprising semiconductor nanowires within the chamber configured as an active driven part of an optical/electrical transducer and configured to be driven to emit light from within the chamber through or to be driven by light received in the chamber via the optically transmissive member.

2. The apparatus of claim 1, further comprising a wick other than semiconductor nanowires.

3. The apparatus of claim 2, wherein the other wick is at least partially reflective.

4. The apparatus of claim 2, wherein the other wick comprises metallic nanowires.

5. The apparatus of claim 1, wherein the semiconductor nanowires are configured as at least part of an electrical-to-optical type transducer, for emitting light via the optically transmissive member of the housing when driven by an electrical current.

6. The apparatus of claim 1, wherein the semiconductor nanowires are configured as at least part of an optical-to-electrical type transducer, for producing an electrical current in response to light received via the optically transmissive member of the housing.

7. The apparatus of claim 1, wherein the working fluid is electrically conductive for carrying an electrical current to or from at least some of the semiconductor nanowires.

8. The apparatus of claim 1, wherein the housing, the chamber and the working fluid together form a thermal conductivity and phase transition heat transfer mechanism for transferring heat away from the optical/electrical transducer within the chamber.

9. The apparatus of claim 1, wherein each semiconductor nanowire comprises:
- a first semiconductor of one of two semiconductor types, the first semiconductor forming a core electrically coupled to a conducting base;

a second semiconductor of the other of the two semiconductor types, the second semiconductor being exposed to the working fluid in the chamber; and a semiconductor junction or intrinsic region formed between the first and second semiconductors.

10. An optical/electrical transducer apparatus, comprising:

a semiconductor transducer including semiconductor nanowires configured to be driven to convert between optical and electrical energy;

a housing having a section that is thermally conductive and a member, that is at least partially optically transmissive, the optically transmissive member being connected to the thermally conductive section of the housing to form a seal for a vapor tight chamber formed by the housing, the semiconductor transducer being mounted with at least the semiconductor nanowires within the chamber and configured so as to be driven to emit light from within the chamber or to receive light to drive the semiconductor nanowires in the chamber, via the optically transmissive member; and a working fluid within the chamber, wherein pressure within the chamber configures the working fluid to absorb heat from the semiconductor transducer during operation of the apparatus, to vaporize at a relatively hot location at or near the semiconductor nanowires as the working fluid absorbs heat, to transfer heat to and condense at a relatively cold location, and to return as a liquid to the relatively hot location.

11. The apparatus of claim 10, wherein the transducer having the semiconductor nanowires is configured as an electrical-to-optical transducer for emitting light when driven by an electrical current.

12. The apparatus of claim 10, wherein the transducer having the semiconductor nanowires is configured as an optical-to-electrical transducer for producing an electrical current in response to light.

13. The apparatus of claim 10, wherein the working fluid is electrically conductive for carrying an electrical current to or from at least some of the semiconductor nanowires.

14. The apparatus of claim 10, wherein the housing, the chamber and the working fluid together form a thermal conductivity and phase transition heat transfer mechanism for transferring heat away from the semiconductor transducer.

15. The apparatus of claim 10, wherein each semiconductor nanowire comprises:

a first semiconductor of one of two semiconductor types, the first semiconductor forming a core electrically coupled to a conducting base;

a second semiconductor of the other of the two semiconductor types, the second semiconductor being exposed to the working fluid in the chamber; and a semiconductor junction or intrinsic region formed between the first and second semiconductors.

16. An optical/electrical transducer apparatus, comprising:

a housing having a section that is thermally conductive and a member that is at least partially optically transmissive, the optically transmissive member being connected to the thermally conductive section of the housing to form a seal for a vapor tight chamber;

a working fluid within the chamber, wherein pressure within the chamber configures the working fluid to absorb heat during operation of the apparatus, to vaporize at a relatively hot location as the working fluid absorbs heat, to transfer heat to and condense at a relatively cold location, and to return as a liquid to the relatively hot location; and semiconductor nanowires, mounted within the chamber, configured to be in contact with the working fluid and to operate electrically as at least part of an active optical/electrical transducer to convert between optical and electrical energy, the semiconductor nanowires being positioned to be driven to emit light from inside the chamber through or to be driven by light received in the chamber via the optically transmissive member when operating as part of the optical/electrical transducer.

17. The apparatus of claim 16, wherein the semiconductor nanowires are configured to operate as an electrical-to-optical transducer for emitting light when driven by an electrical current.

18. The apparatus of claim 16, wherein the semiconductor nanowires are configured to operate as an optical-to-electrical transducer for producing an electrical current in response to light.

19. The apparatus of claim 16, wherein the housing, the chamber and the working fluid together form a thermal conductivity and phase transition heat transfer mechanism for transferring heat away from the semiconductor transducer.

20. The apparatus of claim 16, wherein each semiconductor nanowire comprises:

a first semiconductor of one of two semiconductor types, the first semiconductor forming a core electrically coupled to a conducting base;

a second semiconductor of the other of the two semiconductor types, the second semiconductor being exposed to the working fluid in the chamber; and a semiconductor junction or intrinsic region formed between the first and second semiconductors.

* * * * *